(12) United States Patent
Huang et al.

(10) Patent No.: US 12,040,283 B2
(45) Date of Patent: *Jul. 16, 2024

(54) METHOD OF FABRICATING SEMICONDUCTOR STRUCTURE

(71) Applicant: Taiwan Semiconductor Manufacturing Company, Ltd., Hsinchu (TW)

(72) Inventors: Tzu-Sung Huang, Tainan (TW); Cheng-Chieh Hsieh, Tainan (TW); Hsiu-Jen Lin, Hsinchu County (TW); Hui-Jung Tsai, Hsinchu (TW); Hung-Yi Kuo, Taipei (TW); Hao-Yi Tsai, Hsinchu (TW); Ming-Hung Tseng, Miaoli County (TW); Yen-Liang Lin, Taichung (TW); Chun-Ti Lu, Hsinchu (TW); Chung-Ming Weng, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/303,543

(22) Filed: Apr. 19, 2023

(65) Prior Publication Data
US 2023/0275030 A1    Aug. 31, 2023

Related U.S. Application Data

(60) Continuation of application No. 17/666,579, filed on Feb. 8, 2022, now Pat. No. 11,664,325, which is a
(Continued)

(51) Int. Cl.
*H01L 23/48*    (2006.01)
*H01L 21/56*    (2006.01)
(Continued)

(52) U.S. Cl.
CPC .......... *H01L 23/5389* (2013.01); *H01L 21/56* (2013.01); *H01L 21/78* (2013.01);
(Continued)

(58) Field of Classification Search
CPC .......... H01L 21/56; H01L 21/78; H01L 24/94
See application file for complete search history.

(56) References Cited

U.S. PATENT DOCUMENTS 9,000,584 B2    4/2015    Lin et al.
9,048,222 B2    6/2015    Hung et al.
(Continued)

*Primary Examiner* — Nicholas J Tobergte
(74) *Attorney, Agent, or Firm* — JCIPRNET

(57) ABSTRACT

A package structure including a first semiconductor die, a second semiconductor die, first conductive pillars and a first insulating encapsulation is provided. The first semiconductor die includes a semiconductor substrate, an interconnect structure and a first redistribution circuit structure. The semiconductor substrate includes a first portion and a second portion disposed on the first portion. The interconnect structure is disposed on the second portion, the first redistribution circuit structure is disposed on the interconnect structure, and the lateral dimension of the first portion is greater than the lateral dimension of the second portion. The second semiconductor die is disposed on the first semiconductor die. The first conductive pillars are disposed on the first redistribution circuit structure of the first semiconductor die. The first insulating encapsulation is disposed on the first portion. The first insulating encapsulation laterally encapsulates the second semiconductor die, the first conductive pillars and the second portion.

20 Claims, 18 Drawing Sheets

Related U.S. Application Data division of application No. 16/881,002, filed on May 22, 2020, now Pat. No. 11,244,906.

(51) Int. Cl.
| | |
|---|---|
| *H01L 21/78* | (2006.01) |
| *H01L 23/00* | (2006.01) |
| *H01L 23/31* | (2006.01) |
| *H01L 23/538* | (2006.01) |
| *H01L 25/00* | (2006.01) |
| *H01L 25/065* | (2023.01) |

(52) U.S. Cl.
CPC ......... *H01L 23/3121* (2013.01); *H01L 24/94* (2013.01); *H01L 25/0657* (2013.01); *H01L 25/50* (2013.01)

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 11,664,325 B2 * | 5/2023 | Huang | H01L 24/94 |
| | | | 257/128 |
| 2009/0011543 A1 * | 1/2009 | Karta | H01L 21/561 |
| | | | 257/E23.116 |
| 2015/0041980 A1 * | 2/2015 | Ahn | H01L 21/6835 |
| | | | 257/738 |
| 2017/0373037 A1 * | 12/2017 | Yu | H10N 70/826 |

* cited by examiner

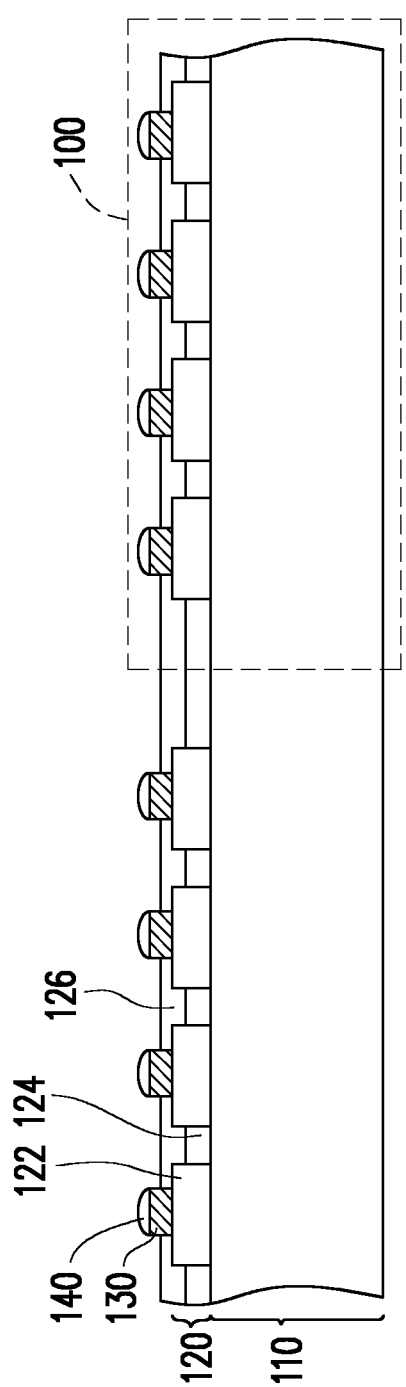
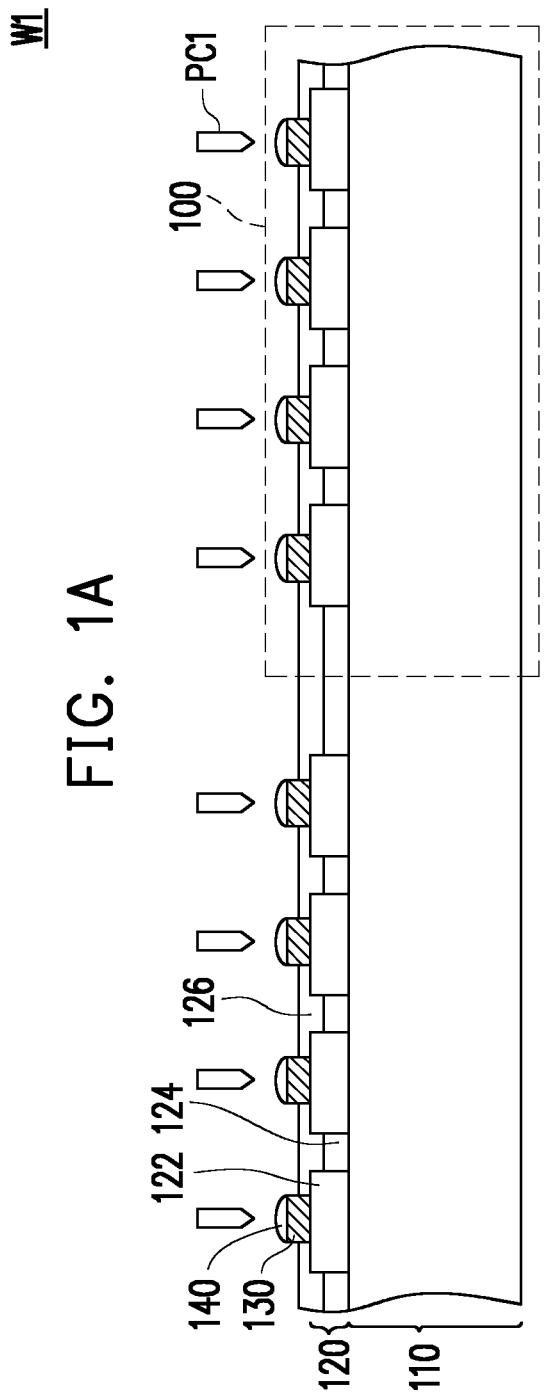

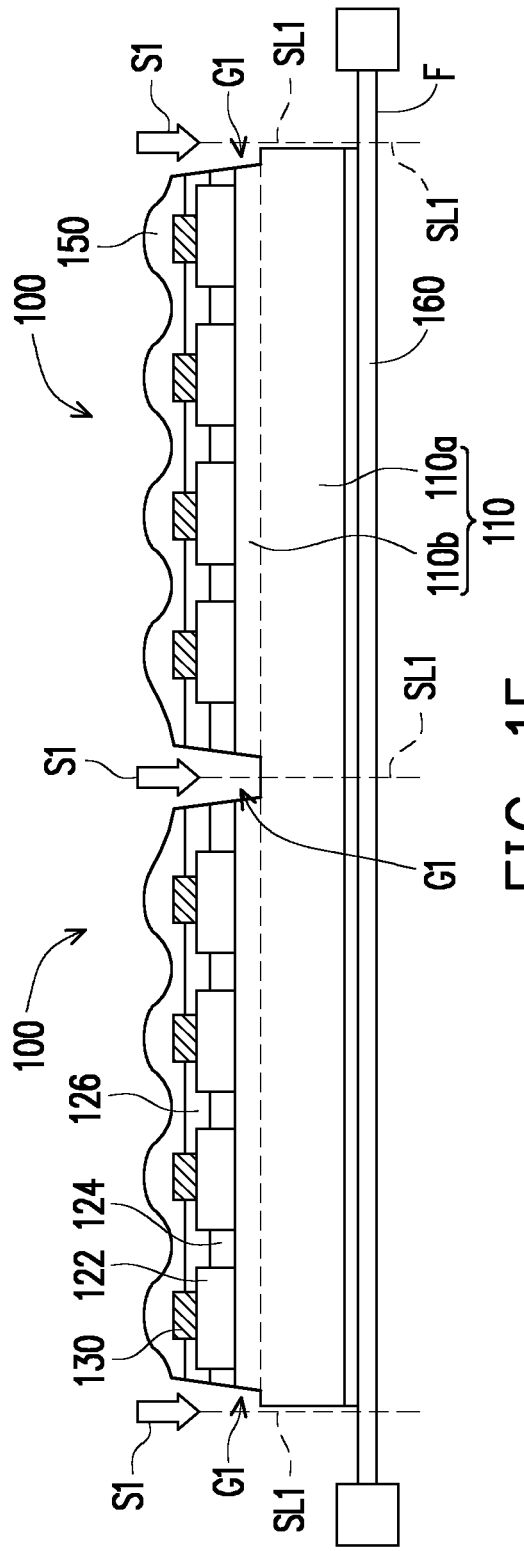
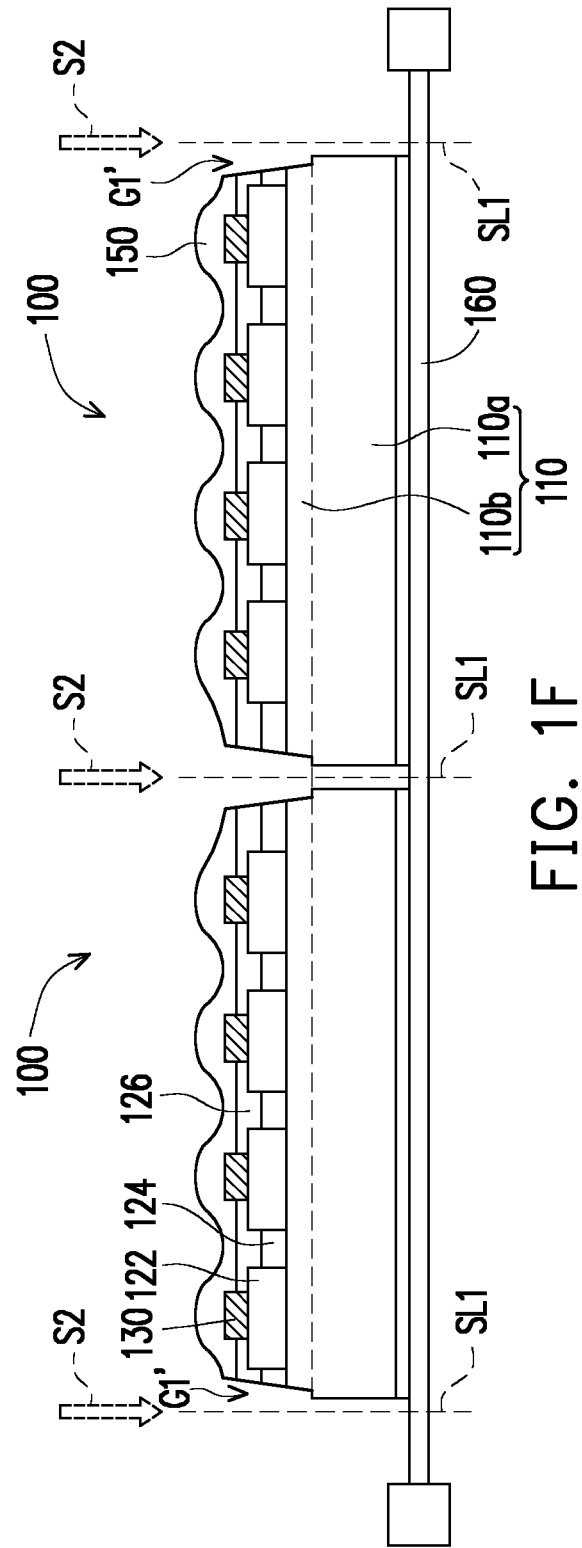
FIG. 1E
FIG. 1F

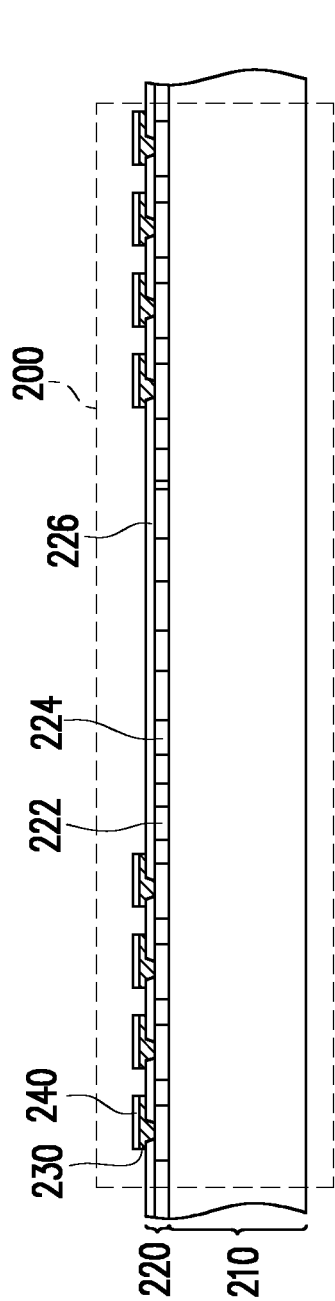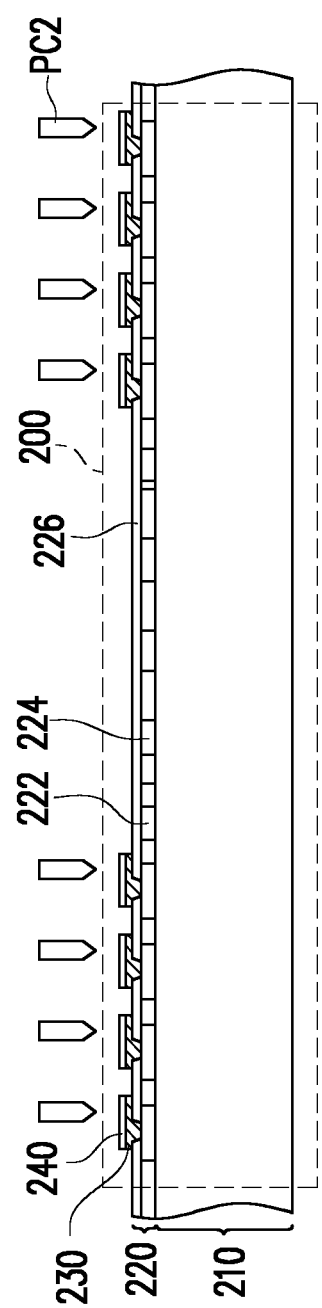

METHOD OF FABRICATING SEMICONDUCTOR STRUCTURE

CROSS-REFERENCE TO RELATED APPLICATION

This application is a continuation application and claims the priority benefit of U.S. application Ser. No. 17/666,579, filed on Feb. 8, 2022, now allowed, which is a divisional application of and claims the priority benefit of U.S. application Ser. No. 16/881,002, filed on May 22, 2020, now issued as U.S. Pat. No. 11,244,906. The entirety of each of the above-mentioned patent applications is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for smaller and more creative packaging techniques of semiconductor dies. Currently, System-on-Integrated-Circuit (SoIC) components are becoming increasingly popular for their multi-functions and compactness. However, there are challenges related to packaging process of the SoIC components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A through FIG. 1F are cross-sectional views schematically illustrating a process flow for fabricating a top tier semiconductor die in accordance with some embodiments of the present disclosure.

FIG. 2A through FIG. 2H are cross-sectional views schematically illustrating a process flow for fabricating a package structure in accordance with some embodiments of the present disclosure.

DETAILED DESCRIPTION

Figure 1C:
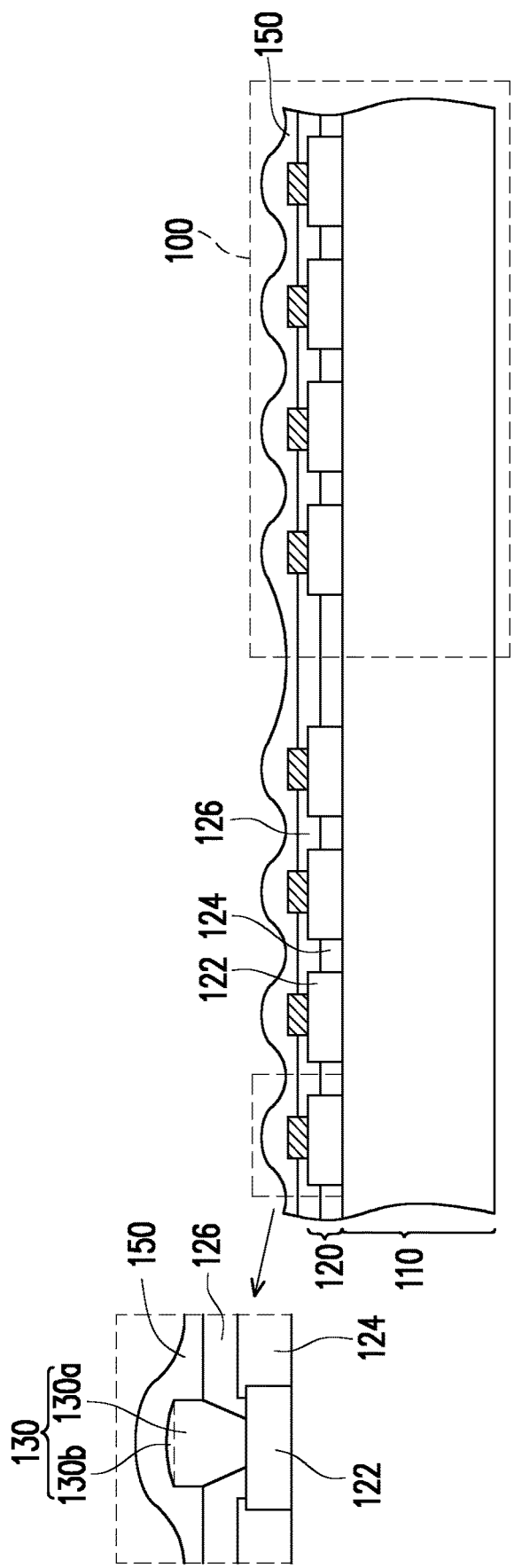

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A through FIG. 1F are cross-sectional views schematically illustrating a process flow for fabricating a top tier semiconductor die in accordance with some embodiments of the present disclosure.

Referring to FIG. 1A, a semiconductor wafer W1 including top tier semiconductor dies 100 arranged in array is provided. The semiconductor wafer W1 may include a semiconductor substrate 110, an interconnect structure 120 disposed on the semiconductor substrate 110, conductive vias 130 disposed on and electrically connected to the interconnect structure 120, and solder material layers 140 disposed on top surfaces of the conductive vias 130. The semiconductor substrate 110 may be a silicon substrate including active components (e.g., transistors or the like) and passive components (e.g., resistors, capacitors, inductors, or the like) formed therein. The active components and passive components are formed in the semiconductor substrate 110 through front end of line (FEOL) fabrication processes of the semiconductor wafer W1. The interconnect structure 120 may include interconnect wirings (e.g., copper interconnect wirings) and dielectric layer stacked alternately, wherein the interconnect wirings of the interconnect structure 120 are electrically connected to the active components and/or the passive components in the semiconductor substrate 110. The interconnect structure 120 is formed through back end of line (BEOL) fabrication processes of the semiconductor wafer W1. The topmost interconnect wirings may include conductive pads 122, and the conductive pads 122 may be aluminum pads, copper pads, or other suitable metallic pads. The interconnect structure 120 may further include a passivation layer 124, wherein the conductive pads 122 are partially covered by the passivation layer 124. In other words, the conductive pads 122 are partially revealed from the openings defined in the passivation layer 124. The passivation 124 may be a silicon oxide layer, a silicon nitride layer, a silicon oxy-nitride layer, or a dielectric layer formed by other suitable inorganic dielectric materials. The interconnect structure 120 may further include a post-passivation layer 126 formed over the passivation layer 124, wherein the post-passivation layer 126 covers the passivation layer 124 and the conductive pads 122, the post-passivation layer 126 includes a plurality of contact openings, and the conductive pads 122 are partially revealed from the contact openings defined in the post passivation layer 126. The post-passivation layer 126 may be a polyimide (PI) layer, a PBO layer, or a dielectric layer formed by other suitable organic dielectric materials. In some embodiments, the post-passivation layer 126 is omitted.

The conductive vias 130 may protrude from the top surface of the post-passivation layer 126. In some embodiments, the conductive vias 130 include copper vias, and the solder material layers 140 include lead free solder material layers. Furthermore, the conductive vias 130 and the solder material layers 140 may be formed over the conductive pads 122 through one or more plating processes. In some embodiments, a seed layer (e.g., Ti/Cu seed layer) is formed on the post-passivation layer 126 and revealed portions of the conductive pads 122 through a sputter process; a patterned photoresist layer is formed on the sputtered seed layer, wherein the patterned photoresist layer includes openings located above the conductive pads 122 for exposing the sputtered seed layer; one or more plating processes are performed such that the conductive vias 130 and the solder material layers 140 are sequentially plated on the sputtered seed layer exposed by the openings defined in the patterned photoresist layer; the patterned photoresist layer is stripped; and portions of the sputtered seed layer which are not covered by the conductive vias 130 and the solder material layers 140 are removed through an etching process until the post-passivation layer 126 is exposed.

Referring to FIG. 1B, a wafer-level chip probing process may be performed on the top tier semiconductor dies 100 in the semiconductor wafer W1. Probe cards PC1 may be provided and pressed onto the solder material layers 140 to perform a wafer-level testing such that tested and reliable known good dies (KGDs) among the top tier semiconductor dies 100 may be recognized. After performing the wafer-level chip probing process, testing marks (e.g., indentation) resulted from the probe pins of the probe cards PC1 may occur on top surfaces of the solder material layers 140. The solder material layers 140 may protect the conductive vias 130 from being directly in contact with and the probe pins of the probe cards PC1.

Referring to FIG. 1C, after performing the wafer-level chip probing process, the solder material layers 140 are removed from the top surfaces of the conductive vias 130. In some embodiments, the solder material layers 140 are removed from the top surfaces of the conductive vias 130 through an etching process. Since the solder material layers 140 are removed, the testing marks (e.g., indentation) on the top surfaces of the solder material layers 140 would not affect the subsequently performed processes. Due to the etching process for removing the solder material layers 140, the conductive vias 130 may be partially etched, and the top surfaces of the conductive vias 130 may become doming-like top surfaces. Each conductive via 130 may include a base portion 130a and a doming portion 130b disposed on the base portion 130a, respectively. For example, the height of the base portion 130a ranges from about 10 micrometers to about 30 micrometers, and the maximum height of the doming portion 130b ranges from about 2 micrometers to about 10 micrometers.

After removing the solder material layers 140 from the top surfaces of the conductive vias 130, a protection layer 150 may be conformally formed over the semiconductor wafer W1 to cover the post-passivation layer 126 and the conductive vias 130. The protection layer 150 may be in contact with sidewalls of the base portions 130a, doming-like top surfaces of the doming portions 130b and the top surface of the post-passivation layer 126. The protection layer 150 may be a polyimide (PI) layer, a PBO layer, or a dielectric layer formed by other suitable organic dielectric materials. The protection layer 150 may be formed through chemical vapor deposition (CVD), physical vapor deposition (PVD), dispensing or other suitable film deposition processes.

Figure 1D:
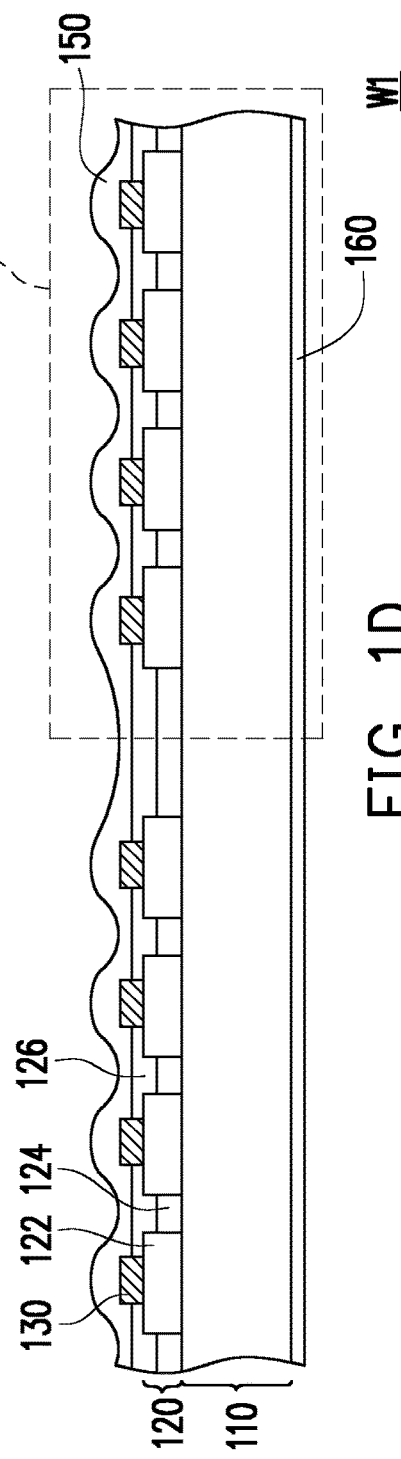

Referring to FIG. 1C and FIG. 1D, a thinning process of the semiconductor wafer W1 is performed such that the semiconductor substrate 110 of the semiconductor wafer W1 is thinned down. In some embodiments, the semiconductor wafer W1 is flipped upside down, and the semiconductor substrate 110 is thinned down from a back surface of the semiconductor wafer W1 through a thinning process. In some embodiments, the semiconductor substrate 110 is thinned down through a mechanical grinding process, a chemical mechanical polishing (CMP) process, an etching process, combinations thereof or other suitable removal processes. After performing the thinning process of the semiconductor wafer W1, a die attachment film 160 may be attached to the back surface of the semiconductor substrate 110.

Referring to FIG. 1E, a frame mount process may be performed such that the semiconductor wafer W1 with reduced thickness is mounted on and attached to a frame F through the die attachment film 160. A pre-cut process S1 is performed along intersected scribe lines SL1 of the semiconductor wafer W1 such that intersected grooves G1 are formed on a front surface of the semiconductor wafer W1. In some embodiments, the grooves G1 are formed through a non-contact cutting process performed along the intersected scribe lines SL1 of the semiconductor wafer W1. For example, the grooves G1 are formed through a laser grooving process performed along the intersected scribe lines SL1 of the semiconductor wafer W1. The grooves G1 may extend through the interconnect structure 120, and portions of the semiconductor substrate 110 are revealed by the grooves G1.

Referring to FIG. 1E and FIG. 1F, a wafer sawing process S2 is performed from the front surface of the semiconductor wafer W1 to saw the semiconductor wafer W1 and die attachment film 160. The wafer sawing process S2 is performed along the grooves G1 or the intersected scribe lines SL1 of the semiconductor wafer W1 to obtain singulated top tier semiconductor dies 100 having ring-shaped grooves G1'. The cutting width of the pre-cut process S1 may be wider than the cutting width of the wafer sawing process S2. In other words, the maximum lateral dimension of the grooves G1 may be wider than the cutting width of the wafer sawing process S2. In some embodiments, the pre-cut process S1 is a laser grooving process while the wafer sawing process S2 is a blade saw process, wherein the cutting width of the pre-cut process S1 (e.g., the laser grooving process) is wider than the cutting width of the wafer sawing process S2 (e.g., the blade saw process). Since the cutting width of the pre-cut process S1 (i.e. the maximum lateral dimension of the grooves G1) is wider than the cutting width of the wafer sawing process S2, the interconnect structure 120 and the protection layer 150 of each singulated top tier semiconductor die 100 may not be in contact with the blade used in the wafer sawing process S2. Accordingly, the pre-cut process S1 (i.e. the grooves G1) may protect the interconnect structure 120 and the protection layer 150 from being damaged during the wafer sawing process S2.

As illustrated in FIG. 1F, the singulated top tier semiconductor die 100 may include the semiconductor substrate 110 and the interconnect structure 120 disposed on the semiconductor substrate 110. The thickness of the semiconductor substrate 110 may range from about 40 micrometers to about 100 micrometers. The semiconductor substrate 110 may include a first portion 110a and a second portion 110b disposed on the first portion 110a, wherein the interconnect structure 120 is disposed on the second portion 110b, and the lateral dimension of the first portion 110a is greater than the lateral dimension of the second portion 110b. The lateral dimension of the second portion 110b and the lateral dimension of the interconnect structure 120 are determined by the cutting width of the pre-cut process S1 (i.e. the maximum lateral dimension of the grooves G1 or G1') while the lateral dimension of the first portion 110a is determined by the cutting width of the wafer sawing process S2 (e.g., the blade saw process). In some embodiments, the maximum lateral dimension of the grooves G1' ranges from about 5 micrometers to about 30 micrometers, and the depth of the grooves G1' ranges from about 10 micrometers to about 30 micrometers.

Figure 3:
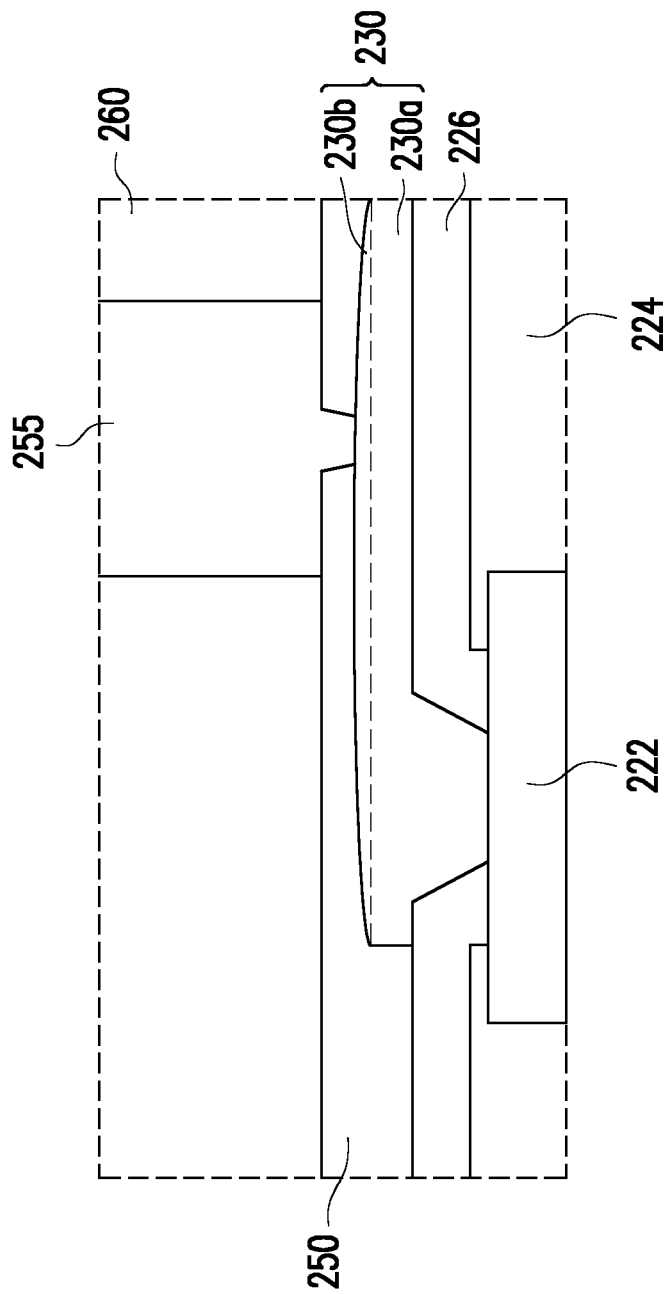
FIG. 3 is an enlarged cross-sectional view of the region X illustrated in FIG. 2E.
Figure 4:
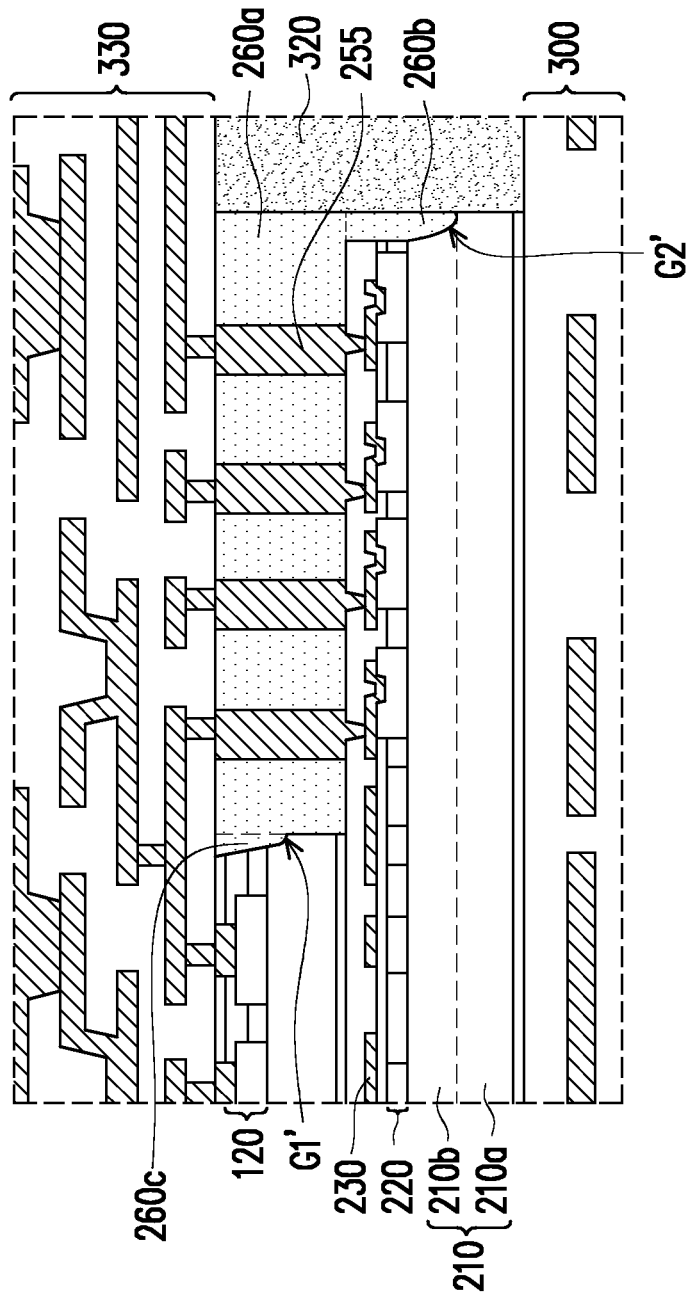
FIG. 4 is an enlarged cross-sectional view of the region Y illustrated in FIG. 2G.

FIG. 2A through FIG. 2H are cross-sectional views schematically illustrating a process flow for fabricating a package structure in accordance with some embodiments of the present disclosure. FIG. 3 is an enlarged cross-sectional view of the region X illustrated in FIG. 2E. FIG. 4 is an enlarged cross-sectional view of the region Y illustrated in FIG. 2G.

Referring to FIG. 2A, a semiconductor wafer W2 including bottom tier semiconductor dies 200 arranged in array is provided. The semiconductor wafer W2 may include a semiconductor substrate 210, an interconnect structure 220 disposed on the semiconductor substrate 210, a redistribution circuit structure 230 (i.e. a first redistribution circuit structure) and solder material layers 240 disposed on top surfaces of the redistribution circuit structure 230. The semiconductor substrate 210 may be a silicon substrate including active components (e.g., transistors or the like) and passive components (e.g., resistors, capacitors, inductors, or the like) formed therein. The active components and passive components are formed in the semiconductor substrate 210 through front end of line (FEOL) fabrication processes of the semiconductor wafer W2. The interconnect structure 220 may include interconnect wirings (e.g., copper interconnect wirings) and dielectric layer stacked alternately, wherein the interconnect wirings of the interconnect structure 220 are electrically connected to the active components and/or the passive components in the semiconductor substrate 210. The interconnect structure 220 is formed through back end of line (BEOL) fabrication processes of the semiconductor wafer W2. The topmost interconnect wirings may include conductive pads 222, and the conductive pads 222 may be aluminum pads, copper pads, or other suitable metallic pads. The interconnect structure 220 may further include a passivation layer 224, wherein the conductive pads 222 are partially covered by the passivation layer 224. In other words, the conductive pads 222 are partially revealed from the openings defined in the passivation layer 224. The passivation layer 224 may be a silicon oxide layer, a silicon nitride layer, a silicon oxy-nitride layer, or a dielectric layer formed by other suitable inorganic dielectric materials. The interconnect structure 220 may further include a post-passivation layer 226 formed over the passivation layer 224, wherein the post-passivation layer 226 covers the passivation layer 224 and the conductive pads 222, the post-passivation layer 226 includes a plurality of contact openings, and the conductive pads 222 are partially revealed from the contact openings defined in the post passivation layer 226. The post-passivation layer 226 may be a polyimide (PI) layer, a PBO layer, or a dielectric layer formed by other suitable organic dielectric materials. In some embodiments, the post-passivation layer 226 is omitted.

The redistribution circuit structure 230 may be formed on the post passivation layer 226 and electrically connected to the conductive pads 222 through the contact openings defined in the post passivation layer 226. In some embodiments, the redistribution circuit structure 230 includes copper redistribution wirings, and the solder material layers 240 include lead free solder material layers. Furthermore, the redistribution circuit structure 230 and the solder material layers 240 may be formed over the conductive pads 222 through one or more plating processes. In some embodiments, a seed layer (e.g., Ti/Cu seed layer) is formed on the post-passivation layer 226 and revealed portions of the conductive pads 222 through a sputter process; a patterned photoresist layer is formed on the sputtered seed layer, wherein the patterned photoresist layer includes openings located above the conductive pads 222 for exposing the sputtered seed layer; one or more plating processes are performed such that the redistribution circuit structure 230 and the solder material layers 240 are sequentially plated on the sputtered seed layer exposed by the openings defined in the patterned photoresist layer; the patterned photoresist layer is stripped; and portions of the sputtered seed layer which are not covered by the redistribution circuit structure 230 and the solder material layers 240 are removed through an etching process until the post-passivation layer 226 is exposed.

Referring to FIG. 2B, a wafer-level chip probing process may be performed on the bottom tier semiconductor dies 200 in the semiconductor wafer W2. Probe cards PC2 may be provided and pressed onto the solder material layers 240 to perform a wafer-level testing such that tested and reliable known good dies (KGDs) among the bottom tier semiconductor dies 200 may be recognized. After performing the wafer-level chip probing process, testing marks (e.g., indentation) resulted from the probe pins of the probe cards PC2 may occur on top surfaces of the solder material layers 240. The solder material layers 240 may protect the redistribution circuit structure 230 from being directly in contact with and the probe pins of the probe cards PC2.

Figure 2C:
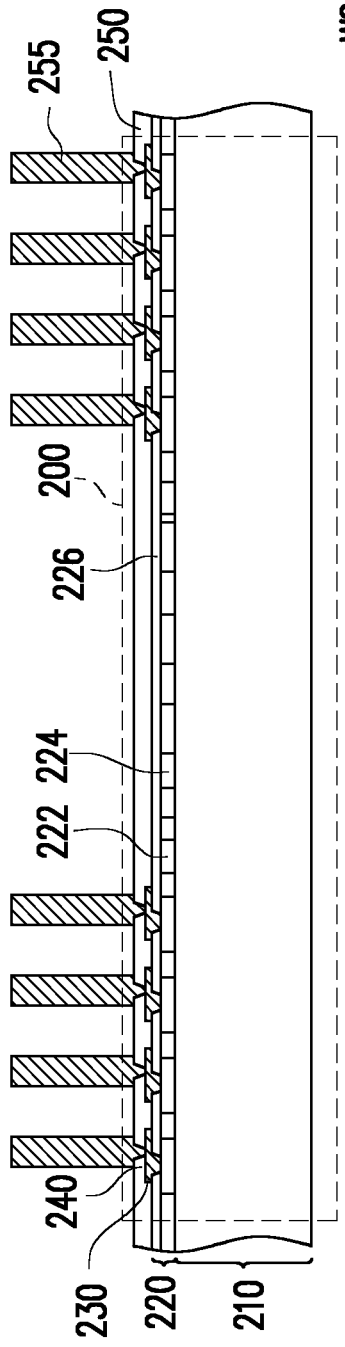

Referring to FIG. 2C, after performing the wafer-level chip probing process, the solder material layers 240 are removed from the top surfaces of the redistribution circuit structure 230. In some embodiments, the solder material layers 240 are removed from the top surfaces of the redistribution circuit structure 230 through an etching process. Since the solder material layers 240 are removed, the testing marks (e.g., indentation) on the top surfaces of the solder material layers 240 would not affect the subsequently performed processes. As illustrated in FIG. 3, due to the etching process for removing the solder material layers 240, the redistribution circuit structure 230 may be partially etched and the top surfaces of the redistribution circuit structure 230 may become doming-like top surfaces. Each redistribution wiring of the redistribution circuit structure 230 may include a base portion 230a and a doming portion 230b disposed on the base portion 230a, respectively. For example, the height of the base portion 230a ranges from about 10 micrometers to about 20 micrometers, and the maximum height of the doming portion 230b ranges from about 0.5 micrometer to about 3 micrometers.

After removing the solder material layers 240 from the top surfaces of the redistribution circuit structure 230, a dielectric layer 250 having a planar top surface may be formed over the semiconductor wafer W2 to cover the post-passivation layer 226 and the redistribution circuit structure 230. The dielectric layer 250 may be in contact with sidewalls of the base portions 230a, doming-like top surfaces of the doming portions 230b and the top surface of the post-passivation layer 226. The dielectric layer 250 may be a polyimide (PI) layer, a PBO layer, or a dielectric layer formed by other suitable organic dielectric materials. The dielectric layer 250 may be formed through chemical vapor deposition (CVD), physical vapor deposition (PVD), dispensing or other suitable film deposition processes. Furthermore, the dielectric layer 250 includes contact openings for exposing portions of the redistribution circuit structure 230.

Conductive pillars 255 (i.e. first conductive pillars) are formed on the dielectric layer 250 and electrically connected to the exposed portions of the redistribution circuit structure 230 through the contact openings defined in the dielectric layer 250. In some embodiments, the width (or diameter) of the contact openings defined in the dielectric layer 250 ranges from about 5 micrometers to about 20 micrometers, the width of the conductive pillars 255 ranges from about 15 micrometers to about 40 micrometers, and the height of the conductive pillars 255 ranges from about 50 micrometers to about 100 micrometers. In some embodiments, the aspect ratio of the conductive pillars 255 ranges from about 2 to about 3.5. The conductive pillars 255 may be formed through a plating process. In some embodiments, a seed layer (e.g., Ti/Cu seed layer) is formed on the dielectric layer 250 and revealed portions of the conductive pads 222 through a sputter process; a patterned photoresist layer is formed on the sputtered seed layer, wherein the patterned photoresist layer includes openings located above the redistribution circuit structure 230 for exposing the sputtered seed layer; a plating process is performed such that the conductive pillars 255 is plated on the sputtered seed layer exposed by the openings defined in the patterned photoresist layer; the patterned photoresist layer is stripped; and portions of the sputtered seed layer which are not covered by the conductive pillars 255 are removed through an etching process until the dielectric layer 250 is exposed.

Figure 2D:
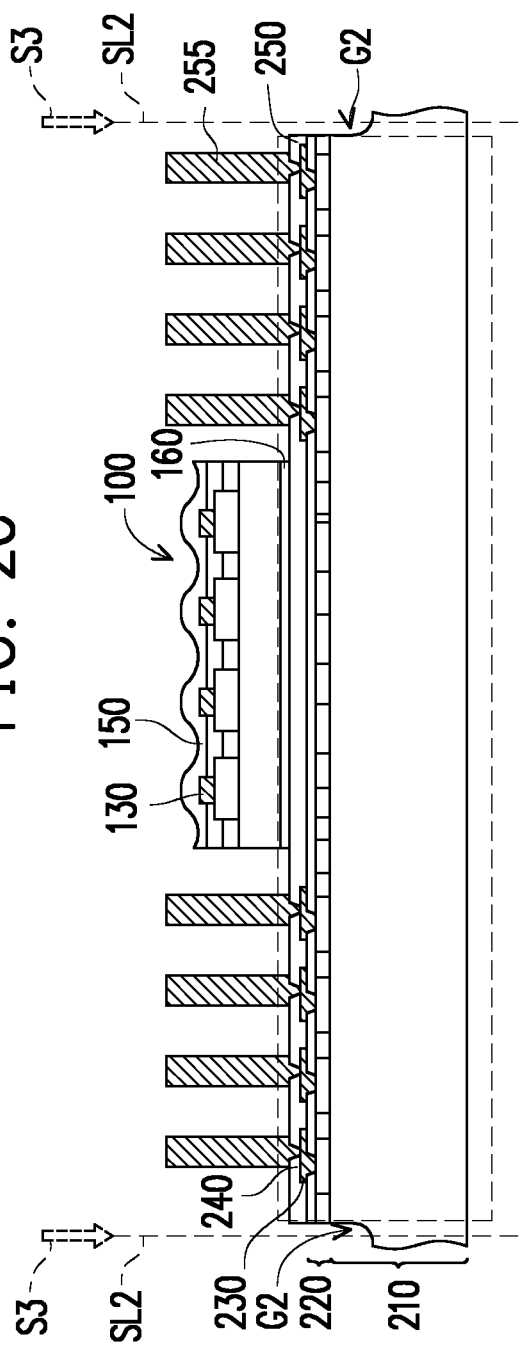

Referring to FIG. 2D, at least one top tier semiconductor die 100 illustrated in FIG. 1F is picked-up and placed on the semiconductor wafer W2. The top tier semiconductor die 100 may be attached on the dielectric layer 250 through the die attachment film 160. The conductive pillars 255 are arranged in array and distributed around the top tier semiconductor die 100. In some embodiments, the height of the conductive pillars 255 is greater than the thickness of the top tier semiconductor die 100. In some other embodiments, the height of the conductive pillars 255 is substantially equal to the thickness of the top tier semiconductor die 100. In some alternative embodiments, the height of the conductive pillars 255 is less than the thickness of the top tier semiconductor die 100, and the top surfaces of the conductive pillars 255 is higher than or substantially leveled with the top surfaces of the conductive vias 130.

As illustrated in FIG. 2D, after the top tier semiconductor die 100 is picked-up and placed on the semiconductor wafer W2, a pre-cut process S3 is performed along intersected scribe lines SL2 of the semiconductor wafer W2 such that intersected grooves G2 are formed on a front surface of the semiconductor wafer W2. In some embodiments, the grooves G2 are formed through a non-contact cutting process performed along the intersected scribe lines SL2 of the semiconductor wafer W2. For example, the grooves G2 are formed through a laser grooving process performed along the intersected scribe lines SL2 of the semiconductor wafer W2. The grooves G2 may extend through the interconnect structure 220, and portions of the semiconductor substrate 210 are revealed by the grooves G2.

Figure 2E:
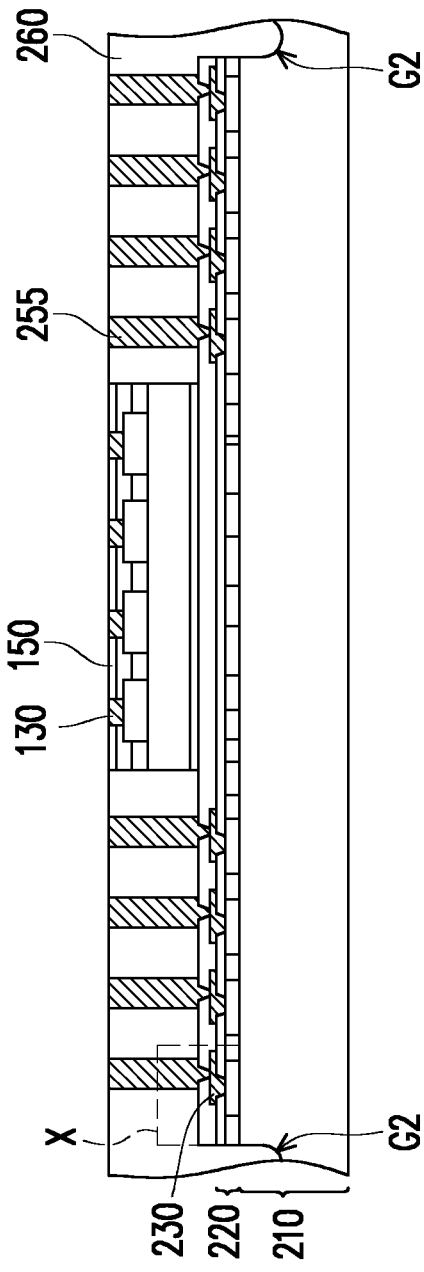

Referring to FIG. 2D and FIG. 2E, after performing the pre-cut process S3, an insulating material is formed to on the semiconductor wafer W2 to cover the top tier semiconductor die 100 and the conductive pillars 255. The insulating material fills the grooves G2. The insulating material may be formed by an over-molding process or a film deposition process. After performing the over-molding process or film deposition process, a grinding process may be performed to partially remove the insulating material until the conductive vias 130 of the top tier semiconductor die 100 and the top surfaces of the conductive pillars 255 are revealed. After the grinding process of the insulating material, an insulating encapsulation 260 is formed over the semiconductor wafer W2 to laterally encapsulate the top tier semiconductor die 100, the conductive pillars 255 and the semiconductor substrate 210. In some embodiments, the grinding process for partially removing the insulating material includes a mechanical grinding process, a CMP process, or combinations thereof. For example, the material of the insulating encapsulation 260 includes Silica, epoxy polymer or other suitable dielectric materials.

As illustrated in FIG. 2E, since the top tier semiconductor die 100 and the conductive pillars 255 are laterally encapsulated by the insulating encapsulation 260, the insulating encapsulation 260 may be merely in contact with the side surfaces of the top tier semiconductor die 100 and sidewalls of the conductive pillars 255. In some embodiments, as illustrated in FIG. 2E, the top surfaces of the top tier semiconductor die 100 and the conductive pillars 255 are substantially leveled with the top surface of the insulating encapsulation 260. In some other embodiments, the top surfaces of the top tier semiconductor die and the conductive pillars are slightly lower or slightly higher than the top surface of the insulating encapsulation 260 due to grinding selectivity.

After forming the insulating encapsulation 260, a thinning process of the semiconductor wafer W2 is performed such that the semiconductor substrate 210 of the semiconductor wafer W2 is thinned down. In some embodiments, the semiconductor wafer W2 is flipped upside down, and the semiconductor substrate 210 is thinned down from a back surface of the semiconductor wafer W2 through a thinning process. In some embodiments, the semiconductor substrate 210 is thinned down through a mechanical grinding process, a CMP process, an etching process, combinations thereof or other suitable removal processes.

Figure 2F:
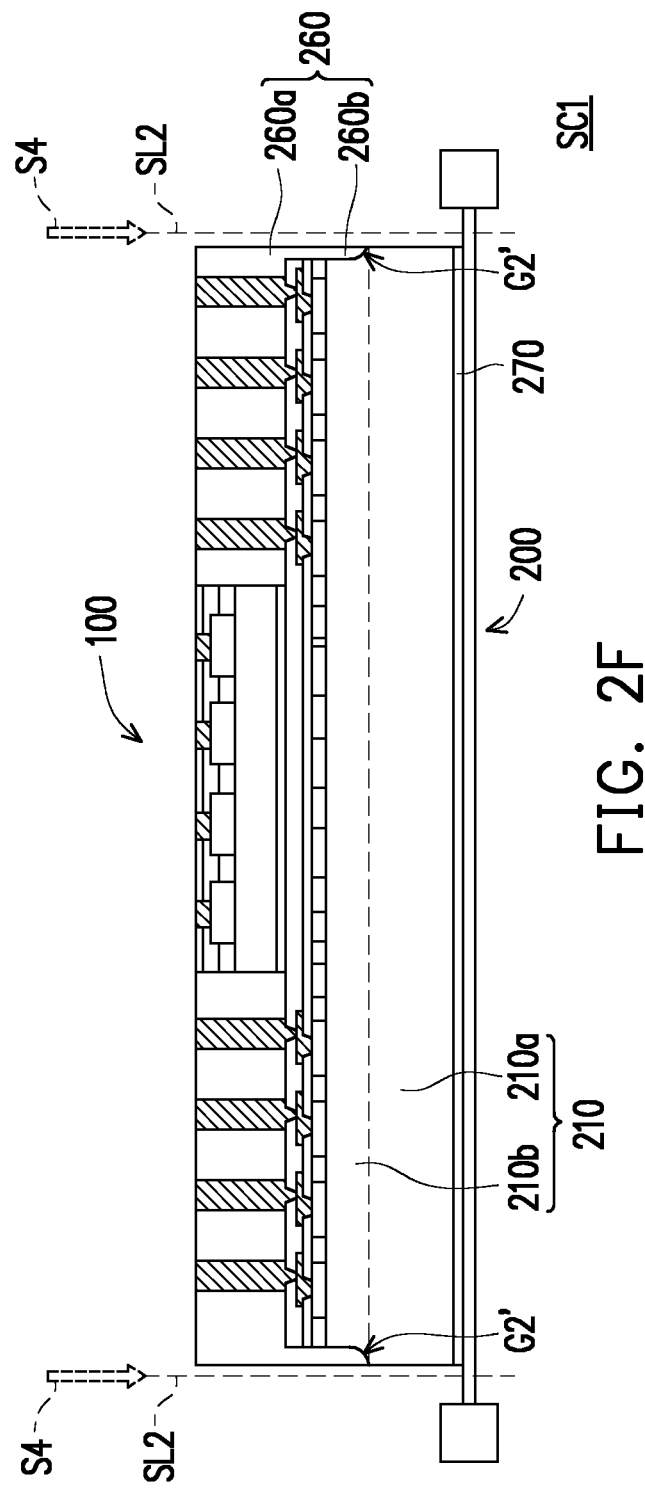

Referring to FIG. 2E and FIG. 2F, after performing the thinning process of the semiconductor wafer W2, a die attachment film 270 may be attached to the back surface of the semiconductor substrate 210. Then, a wafer sawing process S4 is performed from the front surface of the semiconductor wafer W2 to saw the insulating encapsulation 260, the semiconductor wafer W2 and the die attachment film 270. The wafer sawing process S4 may be performed along the grooves G2 or the intersected scribe lines SL2 of the semiconductor wafer W2 to obtain singulated semiconductor components SC1 having ring-shaped grooves G2'. The cutting width of the pre-cut process S3 (illustrated in FIG. 2D) may be wider than the cutting width of the wafer sawing process S4. In other words, the maximum lateral dimension of the grooves G2 (illustrated in FIG. 2E) may be wider than the cutting width of the wafer sawing process S4. In some embodiments, the pre-cut process S3 is a laser grooving process while the wafer sawing process S4 is a blade saw process, wherein the cutting width of the pre-cut process S3 (e.g., the laser grooving process) is wider than the cutting width of the wafer sawing process S4 (e.g., the blade saw process). Since the cutting width of the pre-cut process S3 (i.e. the maximum lateral dimension of the grooves G2) is wider than the cutting width of the wafer sawing process S4, the interconnect structure 220 and the dielectric layer 250 of the singulated bottom tier semiconductor die 200 may not be in contact with the blade used in the wafer sawing process S4. Accordingly, the pre-cut process S3 (i.e. the grooves G2) may protect the interconnect structure 220 and the dielectric layer 250 from being damaged during the wafer sawing process S4.

As illustrated in FIG. 2F, the singulated semiconductor component SC1 may include the bottom tier semiconductor die 200, the top tier semiconductor die 100 stacked over the bottom tier semiconductor die 200, the conductive pillars 255 and the insulating encapsulation 260. The singulated bottom tier semiconductor die 200 may include the semiconductor substrate 210, the interconnect structure 220 disposed on the semiconductor substrate 210 and the redistribution circuit structure 230 disposed on the interconnect structure 220. The thickness of the semiconductor substrate 210 may range from about 60 micrometers to about 100 micrometers. The semiconductor substrate 210 may include a first portion 210a and a second portion 210b disposed on the first portion 210a, wherein the interconnect structure 220 is disposed on the second portion 210b, and the lateral dimension of the first portion 210a is greater than the lateral dimension of the second portion 210b. The lateral dimension of the second portion 210b and the lateral dimension of the interconnect structure 220 are determined by the cutting width of the pre-cut process S3 (i.e. the maximum lateral dimension of the grooves G2 or G2') while the lateral dimension of the first portion 210a is determined by the cutting width of the wafer sawing process S4 (e.g., the blade saw process). Since the redistribution circuit structure 230 is merely distributed on the bottom tier semiconductor die 200, the redistribution circuit structure 230 is a fan-in redistribution circuit structure.

In some embodiments, in the singulated semiconductor component SC1, the lateral dimension of the top tier semiconductor die 100 is less than that of the bottom tier semiconductor die 200, wherein a minimum distance between sidewalls of the top tier semiconductor die 100 and sidewalls of the bottom tier semiconductor die 200 may be greater than 300 micrometers. In the singulated semiconductor component SC1, the maximum lateral dimension of the grooves G2' illustrated in FIG. 2F may range from about 5 micrometers to about 30 micrometers, and the depth of the grooves G2' illustrated in FIG. 2F may range from about 10 micrometers to about 30 micrometers.

In the singulated semiconductor component SC1, the insulating encapsulation 260 covers sidewalls of the second portion 210b of the semiconductor substrate 210, and sidewalls of the insulating encapsulation 260 are substantially aligned with sidewalls of the first portion 210a of the semiconductor substrate 210. The insulating encapsulation 260 may include a body portion 260a and a ring portion 260b, wherein the body portion 260a laterally encapsulates the top tier semiconductor die 100 and the conductive pillars 255, and the ring portion 260b extends along sidewalls of the interconnect structure 220, sidewalls of the redistribution circuit structure 230 and the sidewalls of the second portion 210b. The ring portion 260b extend downwardly into the grooves G2' from the bottom of the body portion 260a. Furthermore, the sidewalls of the interconnect structure 220 may be covered and protected by the ring portion 260b of the insulating encapsulation 260. The ring portion 260b laterally encapsulates the second portion 210b of the semiconductor substrate 210.

Figure 2G:
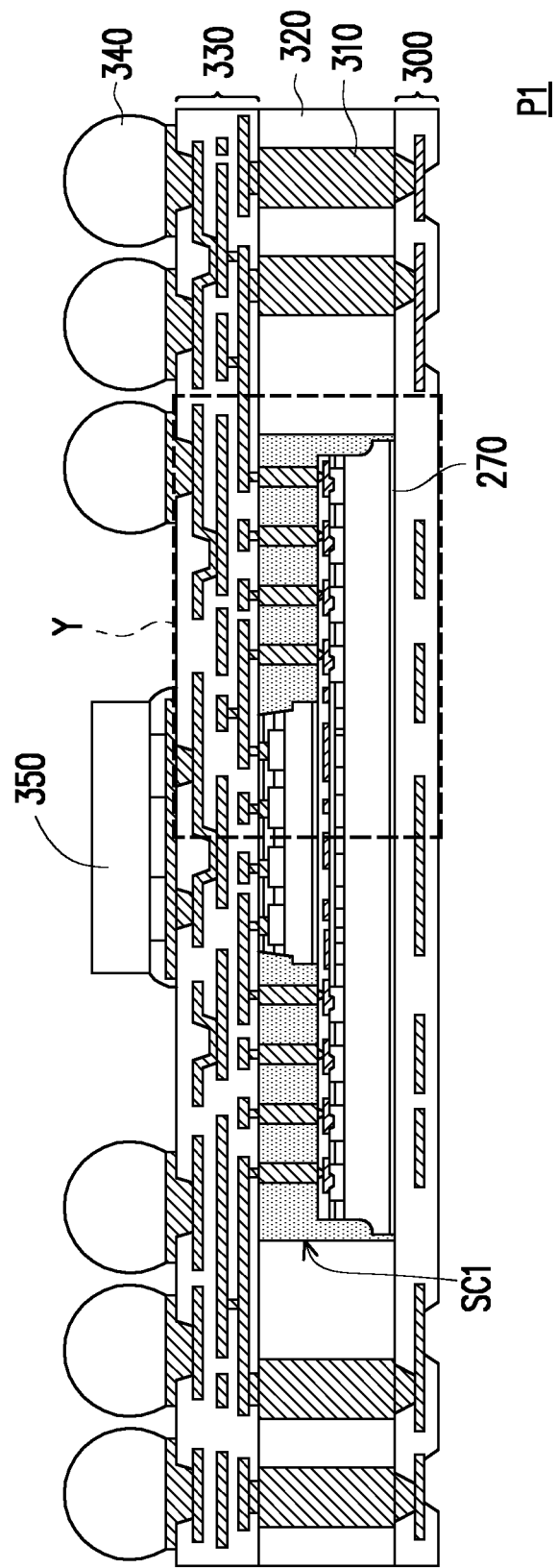

Referring to FIG. 2F and FIG. 2G, the singulated semiconductor component SC1 illustrated in FIG. 2F may be packed through an integrated fan-out packaging process. In some embodiment, a back side fan-out redistribution circuit structure 300 (i.e. a second redistribution circuit structure) is formed on a carrier (not shown); conductive pillars 310 (i.e. second conductive pillars) are formed on and electrically connected to the back side fan-out redistribution circuit structure 300, wherein the width of the conductive pillars 310 ranges from about 150 micrometers to about 250 micrometers, the height of the conductive pillars 310 ranges from about 150 micrometers to about 200 micrometers, and the aspect ratio of the conductive pillars 310 ranges from about 1 to about 2; the singulated semiconductor component SC1 is then picked-up and placed on the back side fan-out redistribution circuit structure 300 such that the singulated semiconductor component SC1 is attached onto the back side fan-out redistribution circuit structure 300 through the die attachment film 270; the singulated semiconductor component SC1 and the conductive pillars 310 are laterally encapsulated with an insulating encapsulation 320, wherein the insulating encapsulation 320 may be formed by an over-molding process followed by a grinding process or a film deposition process followed by a grinding process, the material of the insulating encapsulation 320 includes Silica, epoxy polymer or other suitable dielectric materials, and the coefficient of thermal expansion (CTE) of the insulating encapsulation 320 is different from that of the insulating encapsulation 260; a front side fan-out redistribution circuit structure 330 (i.e. a third redistribution circuit structure) is formed on the singulated semiconductor component SC1, the conductive pillars 310 and the insulating encapsulation 320, wherein the back side fan-out redistribution circuit structure 300 and the front side fan-out redistribution circuit structure 330 are disposed at opposite sides of the conductive pillars 320, and the front side fan-out redistribution circuit structure 330 may be electrically connected to the singulated semiconductor component SC1 through the back side fan-out redistribution circuit structure 300 and the conductive pillars 310; and conductive terminals 340 (e.g., solder balls) and passive components 350 (e.g., resistors, inductors and/or capacitors) are formed on the front side fan-out redistribution circuit structure 330.

As illustrated in FIG. 4, the insulating encapsulation 260 may further include another ring portion 260c, wherein the ring portion 260c laterally extend from inner sidewalls of the body portion 260a to fills the ring-shaped groove G1'. The ring portion 260a and the ring portion 260c of the insulating encapsulation 260 may fill the grooves G1' and G2' respectively such that the interconnect structures 120, the interconnect structure 220 and the redistribution circuit structure 230 are in contact with and surrounded by the insulating encapsulation 260. The interconnect structure 120 is merely in contact with the ring portion 260c of the insulating encapsulation 260. The interconnect structure 220 and the redistribution circuit structure 230 are merely in contact with the ring portion 260b of the insulating encapsulation 260. Since the insulating encapsulation 260 fills the grooves G2', the interconnect structure 220 and the redistribution circuit structure 230 are spaced apart from the insulating encapsulation 320 by the ring portion 260a of the insulating encapsulation 260. Furthermore, the second portion 210b of the semiconductor substrate 210 is spaced apart from the insulating encapsulation 320 by the ring portion 260a of the insulating encapsulation 260, and the insulating encapsulation 320 is merely in contact with the first portion 210a of the semiconductor substrate 210.

As illustrated in FIG. 4, since the interconnect structure 120, the interconnect structure 220 and the redistribution circuit structure 230 are not simultaneously in contact with the insulating encapsulation 260 and the insulating encapsulation 320 with different CTE, the interconnect structure 120, the interconnect structure 220 and the redistribution circuit structure 230 may suffer less stress, and reliability of the interconnect structure 120, the interconnect structure 220 and the redistribution circuit structure 230 may be improved.

Figure 2H:
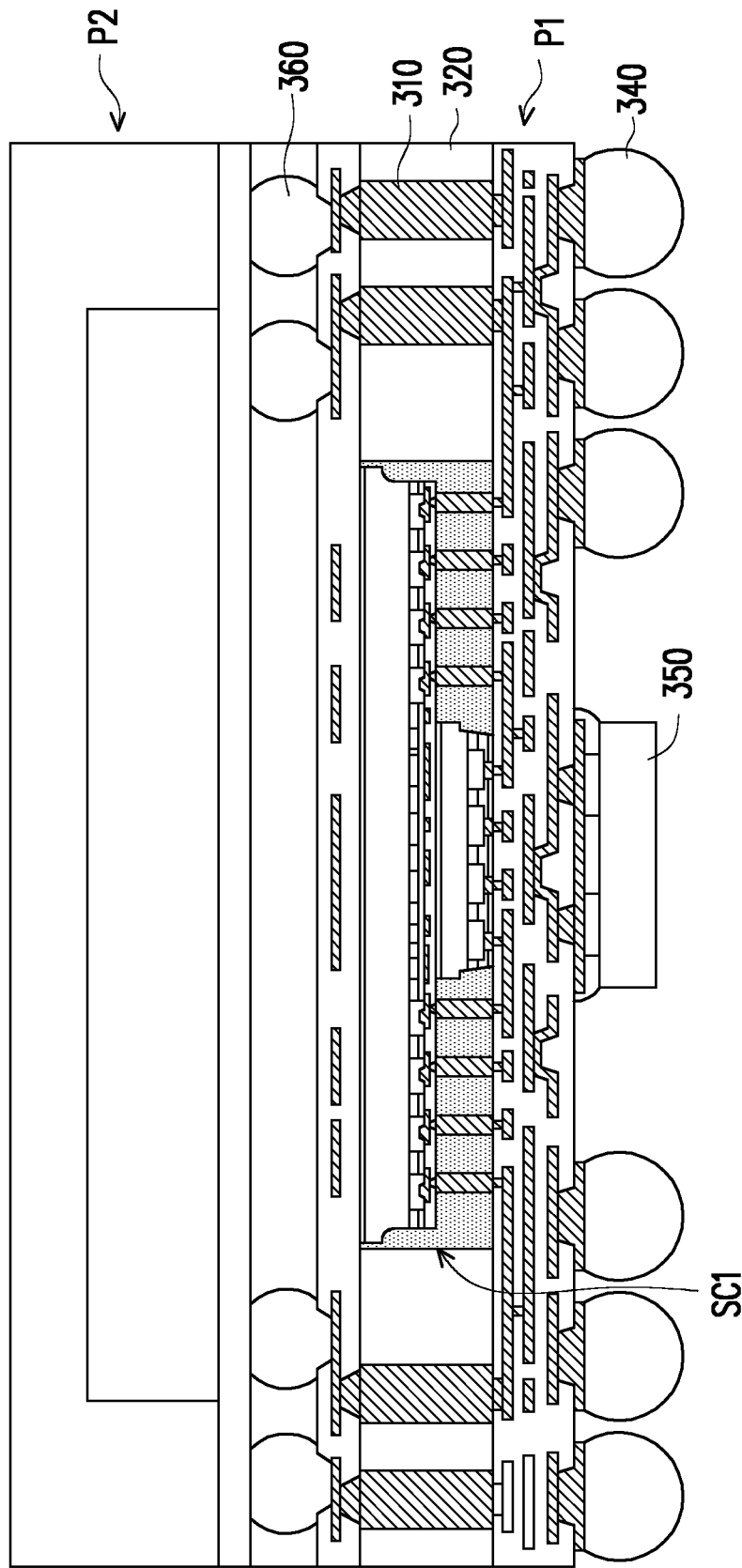

Referring to FIG. 2G and FIG. 2H, after the singulated semiconductor component SC1 is packed through the integrated fan-out packaging process, a wafer-level package structure P1 is fabricated. At least one package P2 including conductive terminals 360 is provided and mounted on the wafer-level package structure P1. In some embodiments, the package P2 is a DRAM package, and the conductive terminals 360 includes solder balls. After mounting the at least one package P2 onto the wafer-level package structure P1, the wafer-level package structure P1 the at least one package P2 may be singulated to obtain at least one package-on-package (PoP) structure.

FIG. 5A through FIG. 5G are cross-sectional views schematically illustrating a process flow for fabricating a package structure in accordance with some alternative embodiments of the present disclosure. FIG. 6 is an enlarged cross-sectional view of the region Z illustrated in FIG. 5G.

Figure 5A:
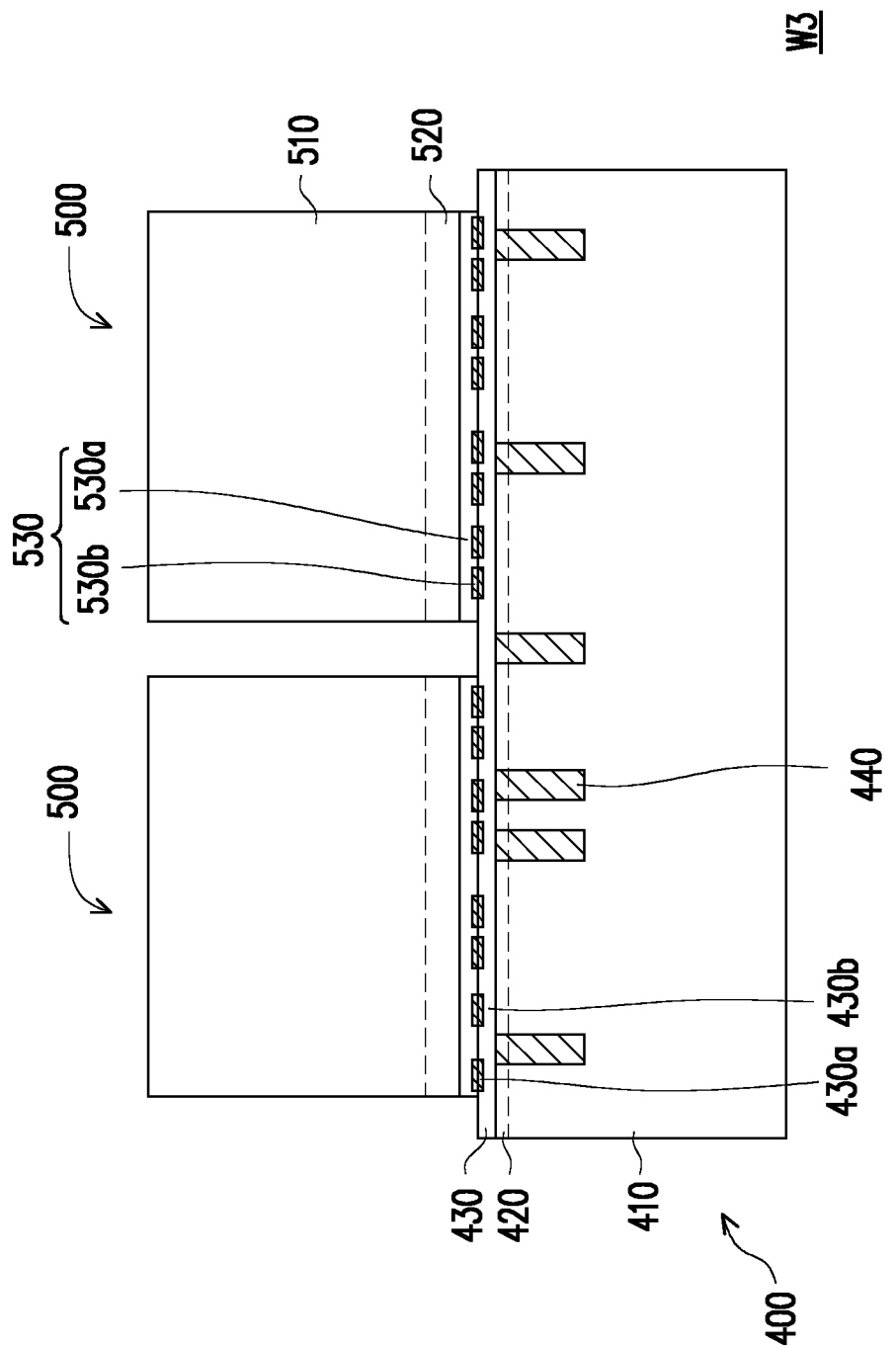
FIG. 5A through FIG. 5G are cross-sectional views schematically illustrating a process flow for fabricating a package structure in accordance with some alternative embodiments of the present disclosure.
Figure 6:
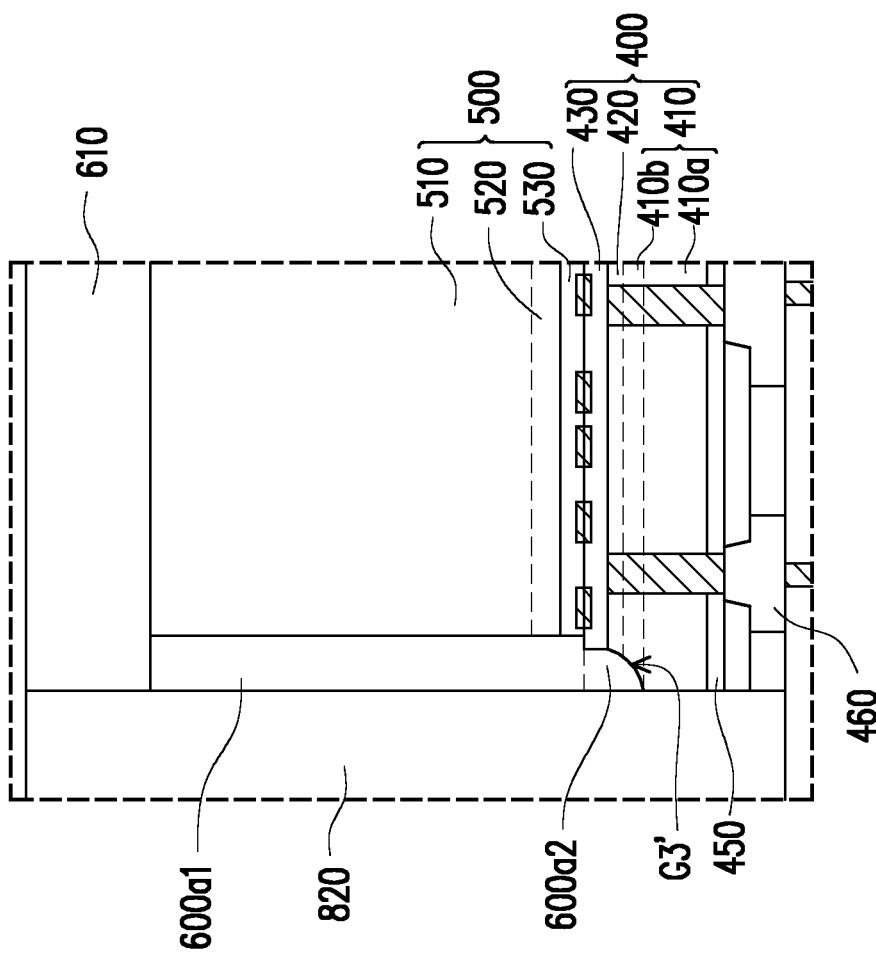
FIG. 6 is an enlarged cross-sectional view of the region Z illustrated in FIG. 5G.

Referring to FIG. 5A, a semiconductor wafer W3 including bottom tier semiconductor dies 400 (only one bottom tier semiconductor die 400 is shown in FIG. 5A for illustration) arranged in array is provided. The semiconductor wafer W3 may include a semiconductor substrate 410, an interconnect structure 420 disposed on the semiconductor substrate 410 and a bonding structure 430 disposed on the interconnect structure 420. The semiconductor substrate 410 may be a silicon substrate including active components (e.g., transistors or the like) and passive components (e.g., resistors, capacitors, inductors, or the like) formed therein. The active components and passive components are formed in the semiconductor substrate 410 through front end of line (FEOL) fabrication processes of the semiconductor wafer W3. The interconnect structure 420 may include interconnect wirings (e.g., copper interconnect wirings) and dielectric layer stacked alternately, wherein the interconnect wirings of the interconnect structure 420 are electrically connected to the active components and/or the passive components in the semiconductor substrate 410. The interconnect structure 420 is formed through back end of line (BEOL) fabrication processes of the semiconductor wafer W3. The bonding structure 430 may include a bonding dielectric layer 430a and bonding conductors 430b embedded in the bonding dielectric layer 430a.

As illustrated in FIG. 5A, the semiconductor wafer W3 may further include through semiconductor vias (TSVs) 440, wherein the through semiconductor vias 440 are electrically connected to the interconnect structure 420 and the bonding structure 430. The through semiconductor vias 440 are embedded in the semiconductor substrate 430 and the interconnect structure 420. Furthermore, the height of the through semiconductor vias 440 is less than the sum of the thickness of the semiconductor substrate 430 and the thickness of the interconnect structure 420.

In some embodiments, the semiconductor wafer W3 is a wafer including logic dies arranged in array. In some alternative embodiments, the semiconductor wafer W3 is an interposer wafer including silicon interposers arranged in array. Other types of semiconductor wafers may be used in the present application.

Top tier semiconductor dies 500 are provided and bonded with the semiconductor wafer W3. The top tier semiconductor dies 500 may each include a semiconductor substrate 510, an interconnect structure 520 disposed on the semiconductor substrate 510 and a bonding structure 530 disposed on the interconnect structure 520. The second semiconductor die is electrically connected to the first semiconductor die through the first and second bonding structures. The semiconductor substrate 510 may be a silicon substrate including active components (e.g., transistors or the like) and passive components (e.g., resistors, capacitors, inductors, or the like) formed therein. The active components and passive components are formed in the semiconductor substrate 510 through front end of line (FEOL) fabrication processes of the semiconductor wafer. The interconnect structure 520 may include interconnect wirings (e.g., copper interconnect wirings) and dielectric layer stacked alternately, wherein the interconnect wirings of the interconnect structure 520 are electrically connected to the active components and/or the passive components in the semiconductor substrate 510. The interconnect structure 520 is formed through back end of line (BEOL) fabrication processes of the semiconductor wafer. The bonding structure 530 may include a bonding dielectric layer 530a and bonding conductors 530b embedded in the bonding dielectric layer 530a.

A chip-to-wafer bonding process is performed such that the top tier semiconductor dies 500 are bonded with the semiconductor wafer W3 through the bonding structure 430 and the bonding structure 530. In some embodiments, a face-to-face hybrid bonding process is performed to bond the top tier semiconductor dies 500 with the semiconductor wafer W3. After performing the bonding process, the bonding dielectric layer 430a of the semiconductor wafer W3 is bonded with the bonding dielectric layers 530a of the top tier semiconductor dies 500, and the bonding conductors 430b of the semiconductor wafer W3 are bonded with the bonding conductors 530b of the top tier semiconductor dies 500.

Figure 5B:
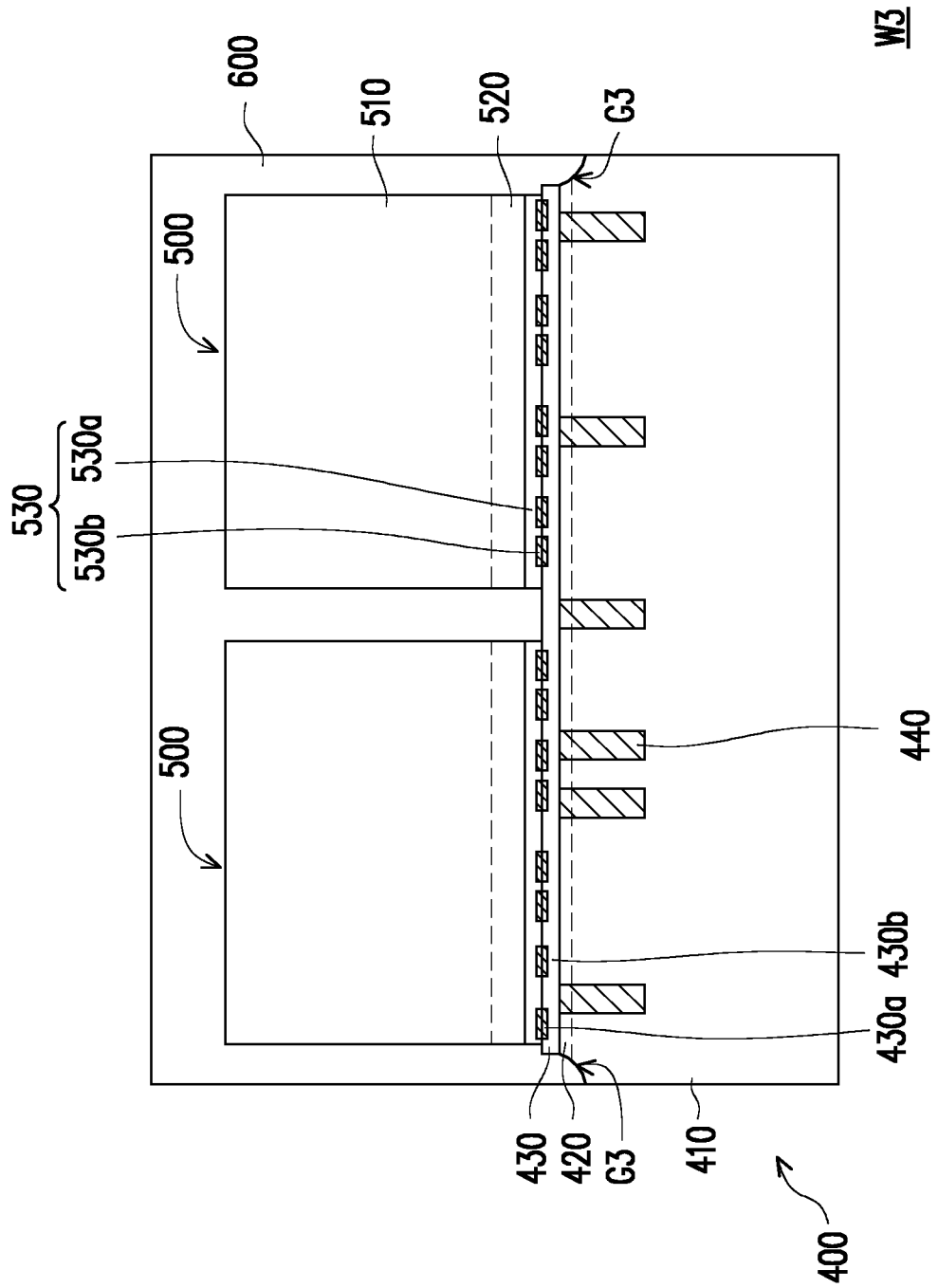

Referring to FIG. 5B, after the top tier semiconductor dies 500 are picked-up and placed on the semiconductor wafer W3, a pre-cut process is performed along intersected scribe lines of the semiconductor wafer W3 such that intersected grooves G3 are formed on a front surface of the semiconductor wafer W3. In some embodiments, the grooves G3 are formed through a non-contact cutting process performed along the intersected scribe lines of the semiconductor wafer W3. For example, the grooves G3 are formed through a laser grooving process performed along the intersected scribe lines of the semiconductor wafer W3. The grooves G3 may extend through the interconnect structure 420, and portions of the semiconductor substrate 410 are revealed by the grooves G3.

After performing the pre-cut process, an insulating material 600 is formed to on the semiconductor wafer W3 to cover the top tier semiconductor dies 500. The insulating material 600 fills the grooves G3. The insulating material 600 may be formed by an over-molding process or a film deposition process. After performing the over-molding process or film deposition process, a first grinding process may be performed to reduce the thickness of the insulating material 600.

Figure 5C:
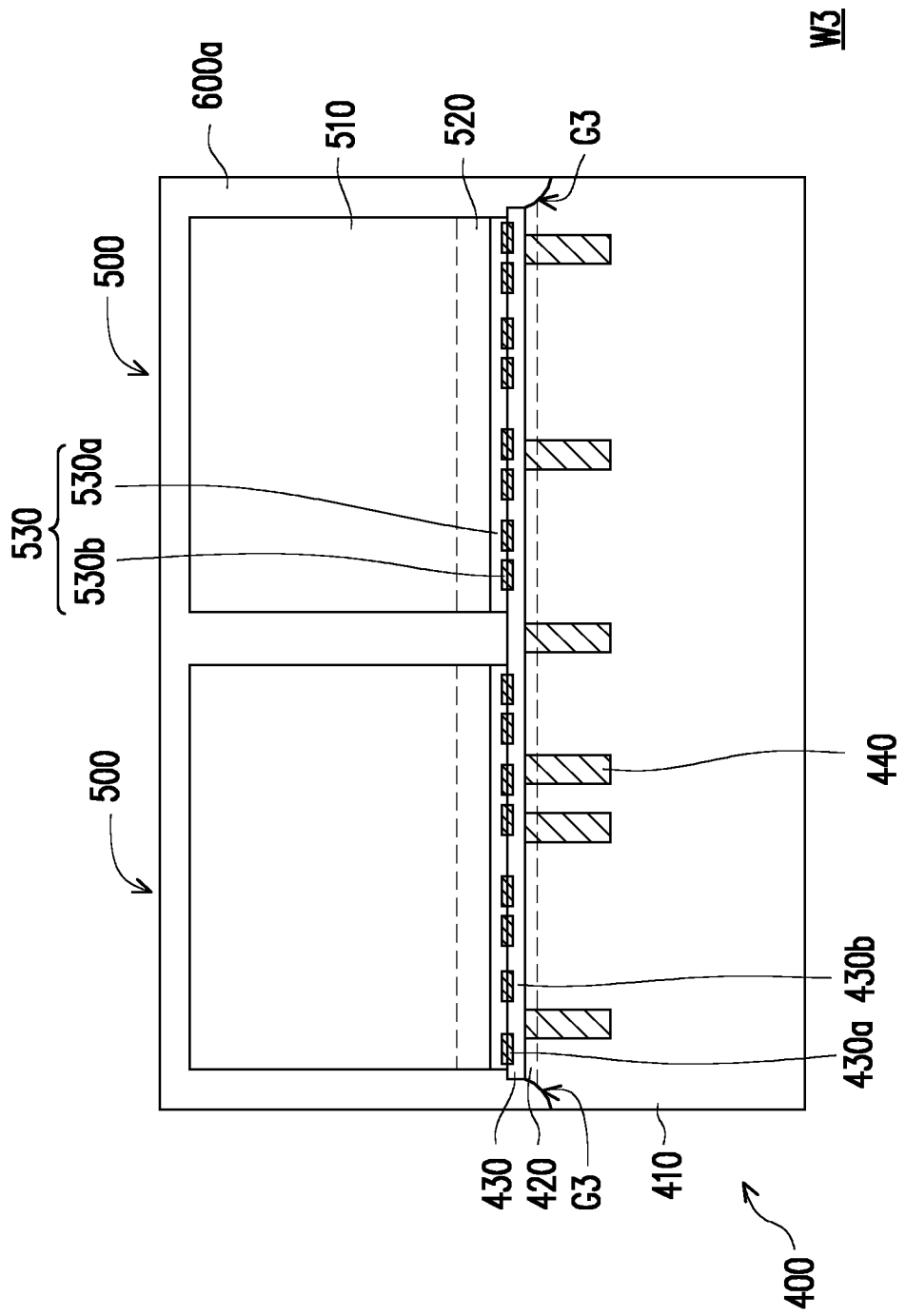

Referring to FIG. 5B and FIG. 5C, after the first grinding process of the insulating material 600 is performed, an insulating encapsulation 600a is formed over the semiconductor wafer W3 to encapsulate the top tier semiconductor dies 500. In some embodiments, the first grinding process for partially removing the insulating material 600 includes a mechanical grinding process, a CMP process, or combinations thereof.

Figure 5D:
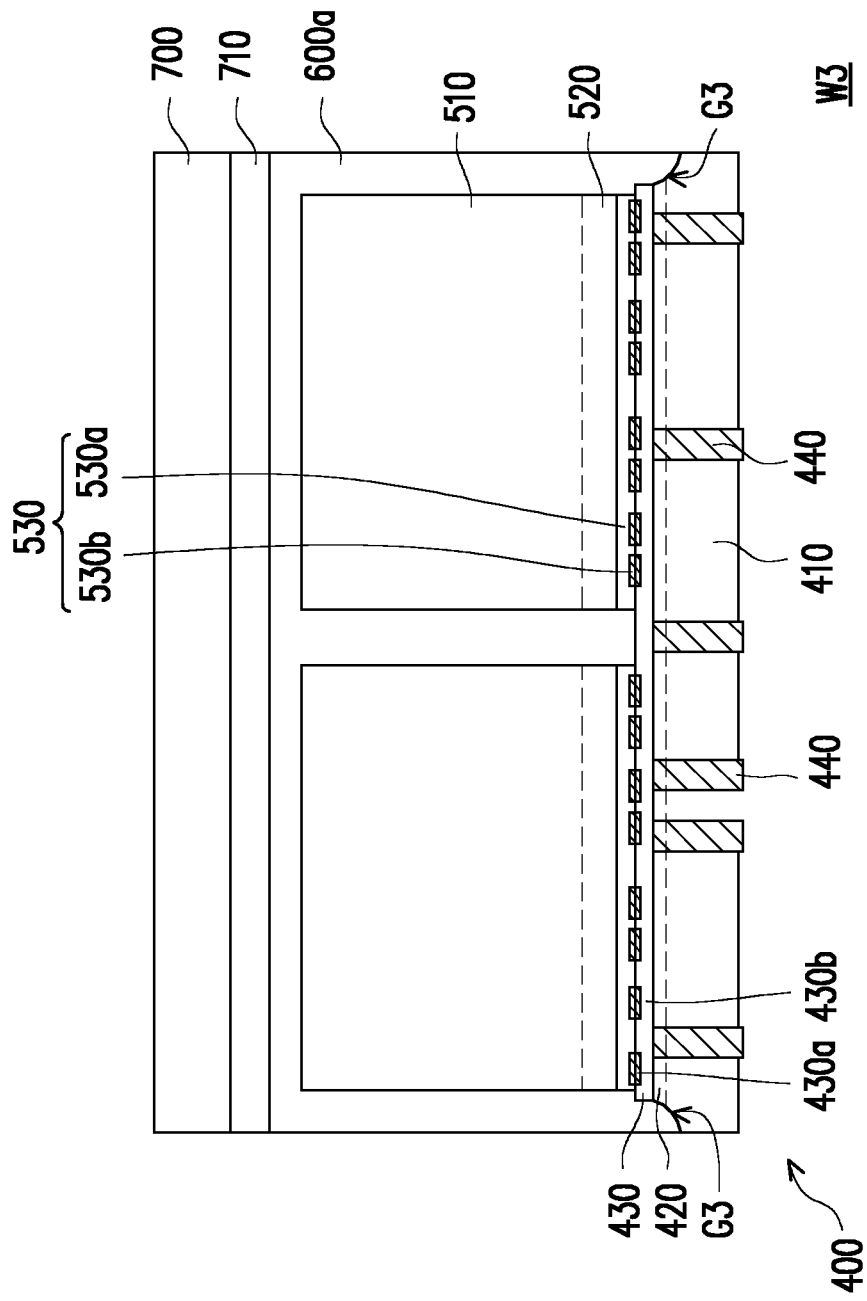

Referring to FIG. 5C and FIG. 5D, the resulted structure illustrated in FIG. 5C is mounted onto a carrier 700 through a die attachment film 710. The insulating encapsulation 600a may be attached to the carrier 700 through the die attachment film 710. Then, a thinning process of the semiconductor wafer W3 is performed such that the semiconductor substrate 410 of the semiconductor wafer W3 is thinned down, and portions of the through semiconductor vias 440 are revealed at a back surface of the semiconductor wafer W3. In some embodiments, the semiconductor wafer W3 is flipped upside down, and the semiconductor substrate 410 is thinned down from a back surface of the semiconductor wafer W3 through a thinning process. In some embodiments, the semiconductor substrate 410 is thinned down through a mechanical grinding process, a CMP process, an etching process, combinations thereof or other suitable removal processes.

Figure 5E:
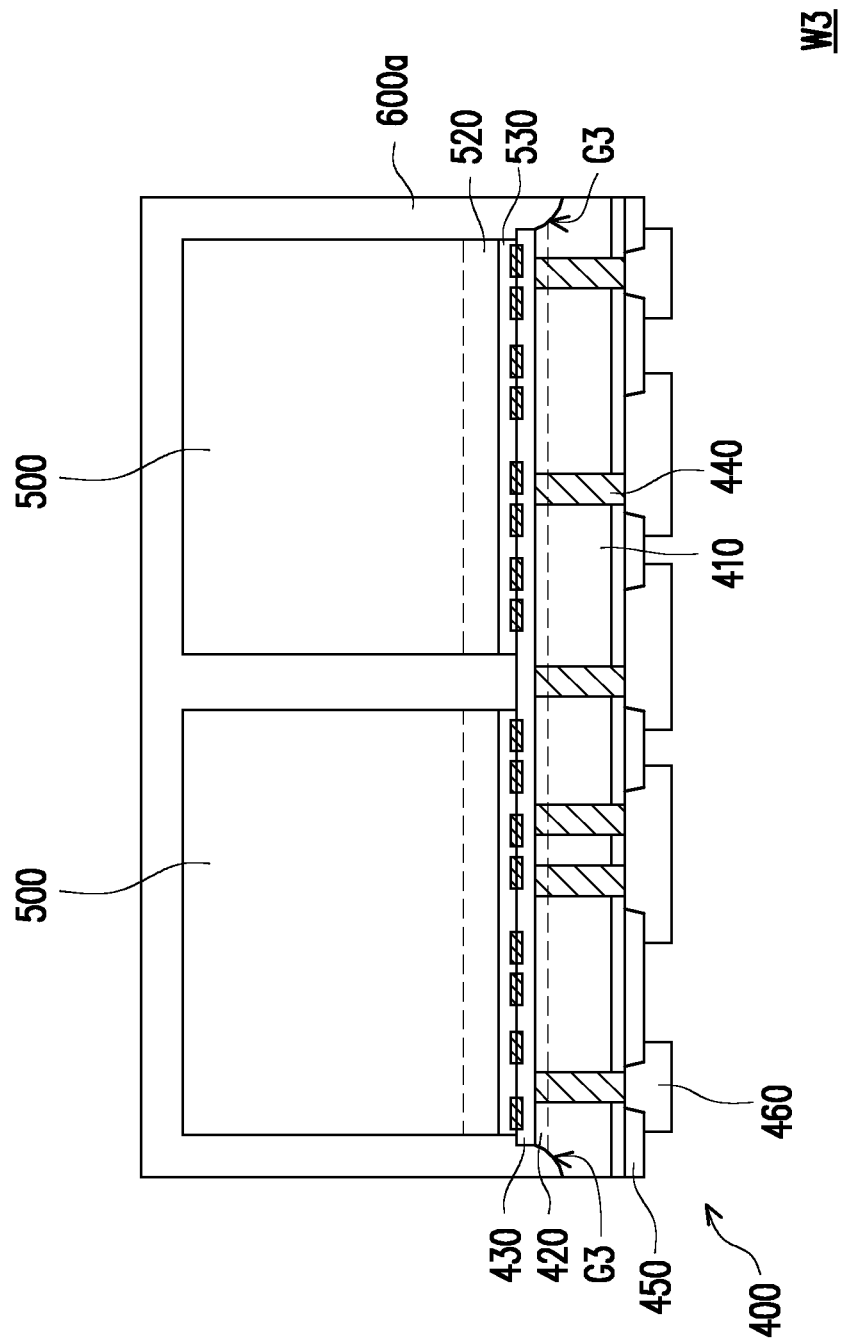

Referring to FIG. 5E, after performing the thinning process of the semiconductor wafer W3, a dielectric layer 450 (e.g., silicon nitride layer) covering the back surface of the semiconductor wafer W3 and conductive vias 460 electrically connected to the through semiconductor vias 440 are formed. Then, a frame mount process may be performed such that the semiconductor wafer W3 including the dielectric layer 450 and the conductive vias 460 formed thereon may be mounted on and attached to a frame, and the carrier 700 and the die attachment film 710 are de-bonded from the insulating encapsulation 600a.

Figure 5F:
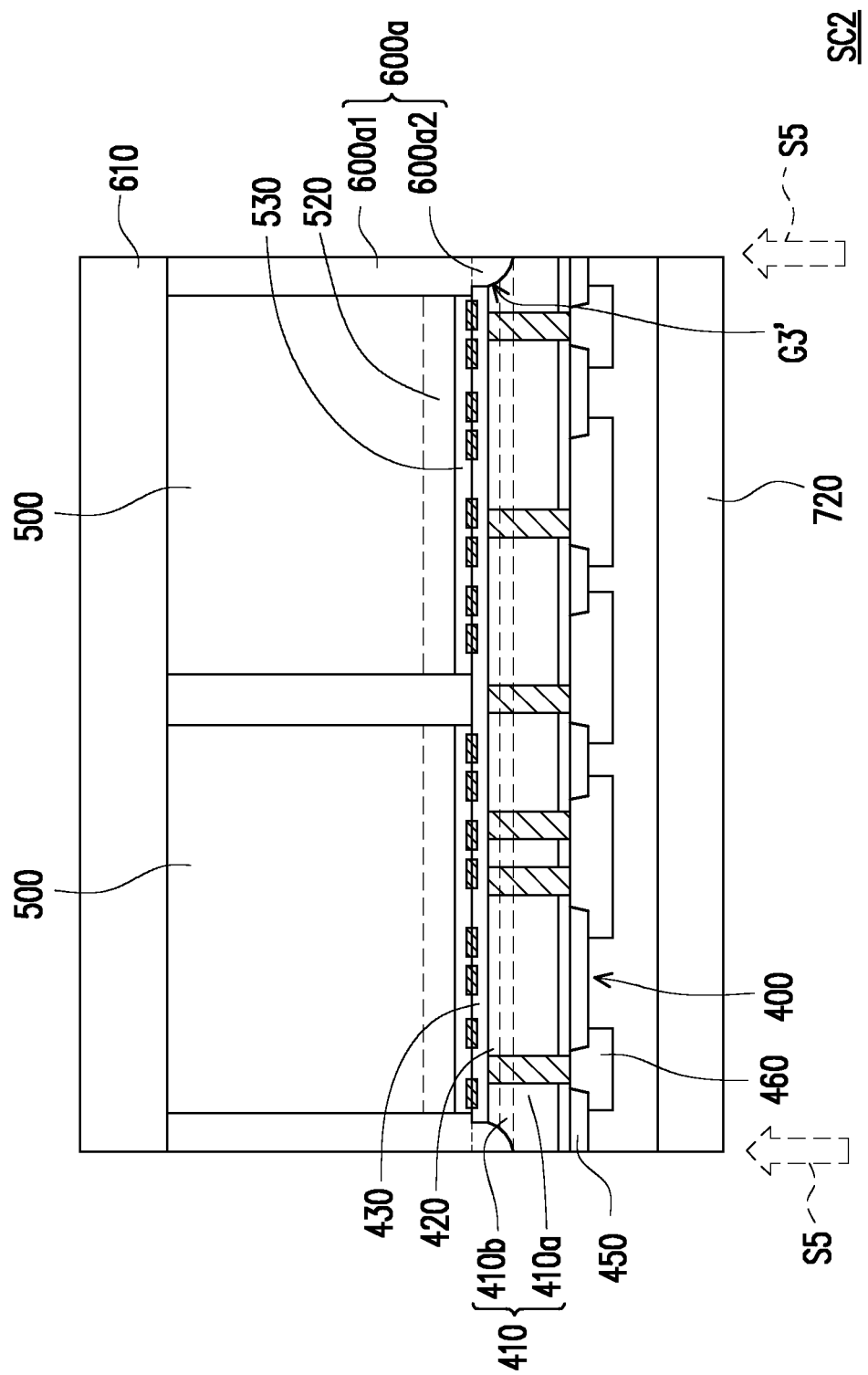

Referring to FIG. 5E and FIG. 5F, after performing the de-bonding process of the carrier 700 and the die attachment film 710, the dielectric layer 450 and the conductive vias 460 may be attached to a tape 720, and a second grinding process is performed to reduce the thickness of the insulating material 600a until the top tier semiconductor dies 500 are revealed. Then, a die attachment film 610 may be provided and attached to the top surface of the insulating material 600a and the revealed surfaces of the top tier semiconductor dies 500.

A wafer sawing process S5 is performed from the back surface of the semiconductor wafer W3 to saw tape 720, the semiconductor wafer W3 and the insulating encapsulation 600a. The wafer sawing process S5 may be performed along the grooves G3 or the intersected scribe lines of the semiconductor wafer W3 to obtain multiple singulated semiconductor components SC2 having grooves G3'. The cutting width of the pre-cut process (illustrated in FIG. 5B) may be wider than the cutting width of the wafer sawing process S5. In other words, the maximum lateral dimension of the grooves G3 (illustrated in FIG. 5B) may be wider than the cutting width of the wafer sawing process S5. In some embodiments, the pre-cut process is a laser grooving process while the wafer sawing process S5 is a blade saw process, wherein the cutting width of the pre-cut process (e.g., the laser grooving process) is wider than the cutting width of the wafer sawing process S5 (e.g., the blade saw process). Since the cutting width of the pre-cut process (i.e. the maximum lateral dimension of the grooves G3) is wider than the cutting width of the wafer sawing process S5, the interconnect structure 420 and the bonding structure 430 of the singulated bottom tier semiconductor die 400 may not be in contact with the blade used in the wafer sawing process S5. Accordingly, the pre-cut process (i.e. the grooves G3) may protect the interconnect structure 420 and the bonding structure 430 from being damaged during the wafer sawing process S5.

Figure 5G:
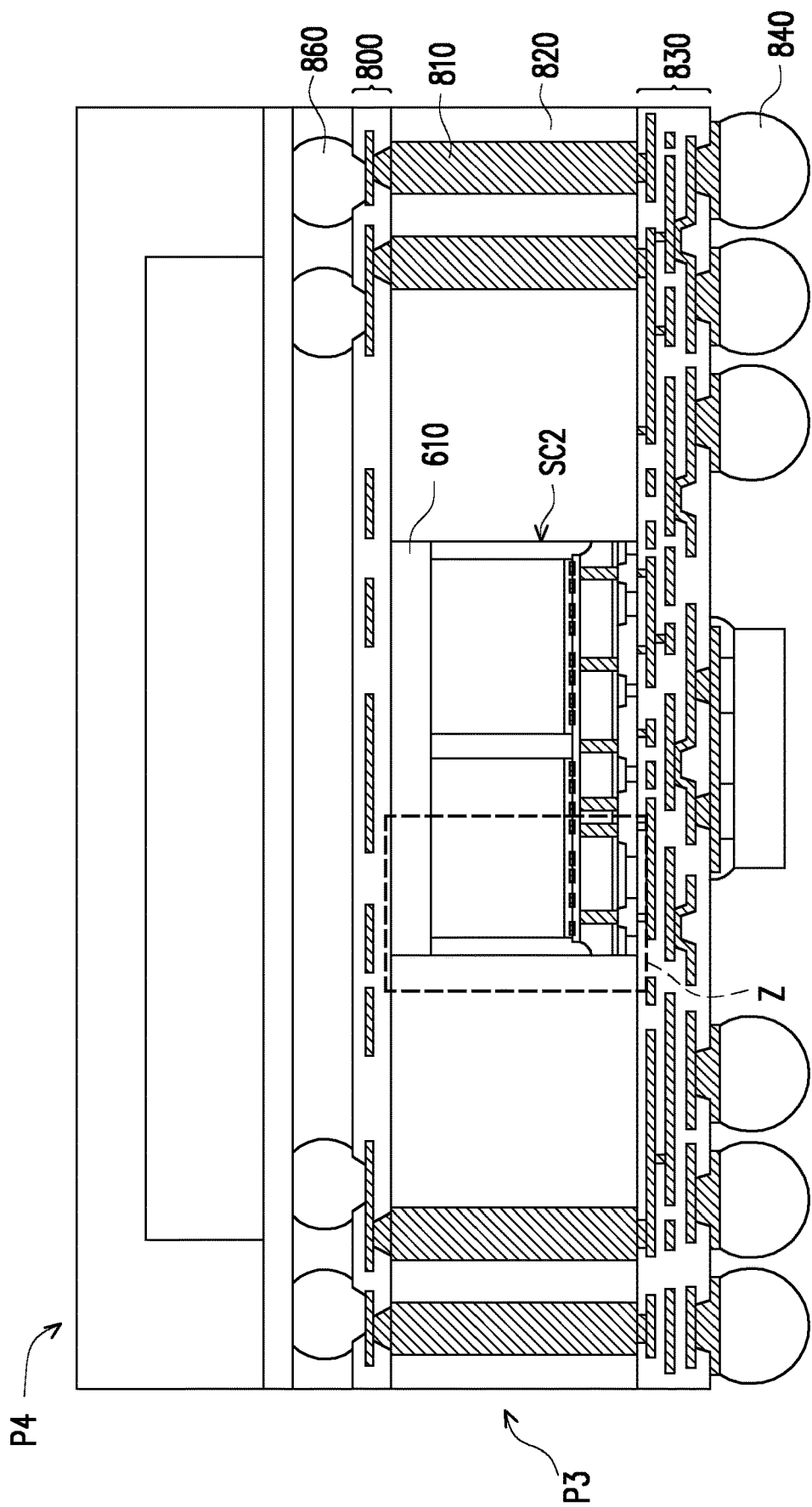

Referring to FIG. 5F and FIG. 5G, each singulated semiconductor component SC2 may include the bottom tier semiconductor die 400, the top tier semiconductor dies 500 stacked over the bottom tier semiconductor die 400 and the insulating encapsulation 600a. The singulated bottom tier semiconductor die 400 may include the semiconductor substrate 410, the interconnect structure 420 disposed on the semiconductor substrate 410 and the bonding structure 430 disposed on the interconnect structure 420. The thickness of the semiconductor substrate 410 may range from about 10 micrometers to about 100 micrometers. The semiconductor substrate 410 may include a first portion 410a and a second portion 410b disposed on the first portion 410a, wherein the interconnect structure 420 is disposed on the second portion 410b, and the lateral dimension of the first portion 410a is greater than the lateral dimension of the second portion 410b. The lateral dimension of the second portion 410b and the lateral dimension of the interconnect structure 420 are determined by the cutting width of the pre-cut process (i.e. the maximum lateral dimension of the grooves G3 or G3') while the lateral dimension of the first portion 410a is determined by the cutting width of the wafer sawing process (e.g., the blade saw process).

In some embodiments, in the singulated semiconductor component SC2, the lateral dimension of the top tier semiconductor dies 500 is less than that of the bottom tier semiconductor die 400. In the singulated semiconductor component SC2, the maximum lateral dimension of the grooves G3' illustrated in FIG. 5F may range from about 5 micrometers to about 30 micrometers, and the depth of the grooves G3' illustrated in FIG. 5F may range from about 10 micrometers to about 30 micrometers.

In the singulated semiconductor component SC2, the insulating encapsulation 600a covers sidewalls of the second portion 410b of the semiconductor substrate 410, and sidewalls of the insulating encapsulation 600a are substantially aligned with sidewalls of the first portion 410a of the semiconductor substrate 410. The insulating encapsulation 600a may include a body portion 600a1 and a ring portion 600a2, wherein the body portion 600a1 laterally encapsulates the top tier semiconductor dies 500, and the ring portion 600a2 extends along sidewalls of the interconnect structure 420, sidewalls of the bonding structure 430 and the sidewalls of the second portion 410b. The ring portion 600a2 extend into the grooves G3' from the bottom of the body portion 600a1. Furthermore, the sidewalls of the interconnect structure 420 may be covered and protected by the ring portion 600a2 of the insulating encapsulation 600a.

The ring portion 600a2 laterally encapsulates the second portion 410b of the semiconductor substrate 410.

Referring to FIG. 5F and FIG. 5G, the singulated semiconductor component SC2 illustrated in FIG. 5F may be packed through an integrated fan-out packaging process. In some embodiment, a fan-out redistribution circuit structure 800 is formed on a carrier (not shown); conductive pillars 810 are formed on and electrically connected to the fan-out redistribution circuit structure 800, wherein the width of the conductive pillars 810 ranges from about 150 micrometers to about 250 micrometers, the height of the conductive pillars 810 ranges from about 150 micrometers to about 200 micrometers, and the aspect ratio of the conductive pillars 810 ranges from about 1 to about 2; the singulated semiconductor component SC2 is then picked-up and placed on the fan-out redistribution circuit structure 800 such that the singulated semiconductor component SC2 is attached onto the fan-out redistribution circuit structure 800 through the die attachment film 610; the singulated semiconductor component SC2 and the conductive pillars 810 are laterally encapsulated with an insulating encapsulation 820, wherein the insulating encapsulation 820 may be formed by an over-molding process followed by a grinding process or a film deposition process followed by a grinding process; a fan-out redistribution circuit structure 830 (i.e. a third redistribution circuit structure) is formed on the singulated semiconductor component SC2, the conductive pillars 810 and the insulating encapsulation 820, wherein the fan-out redistribution circuit structure 800 and the fan-out redistribution circuit structure 830 are disposed at opposite sides of the conductive pillars 820, and the fan-out redistribution circuit structure 800 may be electrically connected to the singulated semiconductor component SC2 through the fan-out redistribution circuit structure 830 and the conductive pillars 810; and conductive terminals 840 (e.g., solder balls) are formed on the fan-out redistribution circuit structure 830.

As illustrated in FIG. 6, the insulating encapsulation 600a may fill the grooves G3' such that the interconnect structure 420 and the bonding structure 430 are in contact with and surrounded by the insulating encapsulation 600a. Since the insulating encapsulation 600a fills the grooves G3', the interconnect structure 420, the bonding structure 430 and the bonding structure 530 are spaced apart from the insulating encapsulation 820 by the insulating encapsulation 600a. Furthermore, the second portion 410b of the semiconductor substrate 410 is spaced apart from the insulating encapsulation 820 by the insulating encapsulation 600a, and the insulating encapsulation 820 is merely in contact with the first portion 410a of the semiconductor substrate 410. In some embodiments, the second portion 410b of the semiconductor substrate 410 is spaced apart from the insulating encapsulation 820 by the ring portion 600a2 of the insulating encapsulation 600a. In some embodiments, the top tier semiconductor dies 500 are spaced apart from the insulating encapsulation 820 by a distance (e.g., greater than 50 micrometers) defined by the body portion 600a1 of the insulating encapsulation 600a.

As illustrated in FIG. 6, since the interconnect structure 420, the interconnect structure 520, the bonding structure 430 and the bonding structure 530 are not simultaneously in contact with the insulating encapsulation 600a and the insulating encapsulation 820 with different CTE, the interconnect structure 420, the interconnect structure 520, the bonding structure 430 and the bonding structure 530 may suffer less stress, and reliability of the interconnect structure 420, the interconnect structure 520, the bonding structure 430 and the bonding structure 530 may be improved.

Referring to FIG. 5G, after the singulated semiconductor component SC2 is packed through the integrated fan-out packaging process, a wafer-level package structure P3 is fabricated. At least one package P4 including conductive terminals 860 is provided and mounted on the wafer-level package structure P3. In some embodiments, the package P4 is a DRAM package, and the conductive terminals 860 includes solder balls. After mounting the at least one package P4 onto the wafer-level package structure P3, the wafer-level package structure P3 and the at least one package P4 may be singulated to obtain at least one package-on-package (PoP) structure.

In accordance with some embodiments of the disclosure, a package structure including a first semiconductor die, a second semiconductor die, first conductive pillars and a first insulating encapsulation is provided. The first semiconductor die includes a semiconductor substrate, an interconnect structure and a first redistribution circuit structure. The semiconductor substrate includes a first portion and a second portion disposed on the first portion, wherein the interconnect structure is disposed on the second portion, the first redistribution circuit structure is disposed on and electrically connected to the interconnect structure, and a first lateral dimension of the first portion is greater than a second lateral dimension of the second portion. The second semiconductor die is disposed on the first semiconductor die. The first conductive pillars are disposed on and electrically connected to the first redistribution circuit structure of the first semiconductor die. The first insulating encapsulation is disposed on the first portion. The first insulating encapsulation laterally encapsulates the second semiconductor die, the first conductive pillars and the second portion. In some embodiments, the first insulating encapsulation covers sidewalls of the second portion, and sidewalls of the first insulating encapsulation are substantially aligned with sidewalls of the first portion. In some embodiments, the first insulating encapsulation includes a body portion and a ring portion, the body portion laterally encapsulates the second semiconductor die and the first conductive pillars, the ring portion extends along sidewalls of the interconnect structure, sidewalls of the first redistribution circuit structure and the sidewalls of the second portion. In some embodiments, the package structure further includes second conductive pillars, a second insulating encapsulation and a second redistribution circuit structure, wherein second insulating encapsulation laterally encapsulates the second conductive pillars, the first insulating encapsulation and the first portion. The second redistribution circuit structure is disposed on the second semiconductor die. The first conductive pillars, the second conductive pillars, the first insulating encapsulation and the second insulating encapsulation. In some embodiments, the first redistribution circuit structure is a fan-in redistribution circuit structure, and the second redistribution circuit structure is a fan-out redistribution circuit structure. In some embodiments, the interconnect structure and the first redistribution circuit structure are spaced apart from the second insulating encapsulation by the first insulating encapsulation. In some embodiments, the package structure further includes a third redistribution circuit structure disposed over the first portion, the second conductive pillars and the second insulating encapsulation, wherein the second and third redistribution circuit structures are disposed at opposite sides of the second conductive pillars.

In accordance with some other embodiments of the disclosure, a package structure including a first semiconductor die, a second semiconductor die and a first insulating encapsulation. The first semiconductor die includes a first semiconductor substrate, a first interconnect structure and a first bonding structure. The first semiconductor substrate includes a first portion and a second portion disposed on the first portion. The first interconnect structure is disposed on the second portion, the first bonding structure is disposed on and electrically connected to the first interconnect structure, and a first lateral dimension of the first portion is greater than a second lateral dimension of the second portion. The second semiconductor die includes a second semiconductor substrate, a second interconnect structure disposed on the second semiconductor substrate and a second bonding structure disposed on the second interconnect structure. The second semiconductor die is electrically connected to the first semiconductor die through the first and second bonding structures. The first insulating encapsulation is disposed on the first portion of the first semiconductor substrate, and the first insulating encapsulation laterally encapsulates the second semiconductor die and the second portion of the first semiconductor substrate. In some embodiments, the first insulating encapsulation covers sidewalls of the second portion of the first semiconductor substrate, and sidewalls of the first insulating encapsulation are substantially aligned with sidewalls of the first portion of the first semiconductor substrate. In some embodiments, the first insulating encapsulation includes a body portion and a ring portion, the body portion laterally encapsulating the second semiconductor die, the ring portion extending along sidewalls of the interconnect structure, sidewalls of the first bonding structure and the sidewalls of the second portion of the first semiconductor substrate. In some embodiments, the package structure further includes conductive pillars, a second insulating encapsulation and a first fan-out redistribution circuit structure. The second insulating encapsulation laterally encapsulates the conductive pillars, the first insulating encapsulation and the first portion of the first semiconductor substrate. The first fan-out redistribution circuit structure is disposed on the second insulating encapsulation and electrically connected to the first semiconductor die and the conductive pillars. In some embodiments, the first semiconductor die includes through semiconductor vias electrically connected to the first redistribution circuit structure. In some embodiments, the first interconnect structure, the second interconnect structure, the first bonding structure and the second bonding structure are spaced apart from the second insulating encapsulation by the first insulating encapsulation. In some embodiments, the package structure further includes a second fan-out redistribution circuit structure disposed on the second semiconductor die, the conductive pillars, the first insulating encapsulation and the second insulating encapsulation. In some embodiments, the package structure further includes a die attachment film disposed between the second semiconductor die and the second fan-out redistribution circuit structure.

In accordance with some other embodiments of the disclosure, a method including the followings is provided. Upper tier semiconductor dies are placed to a semiconductor wafer including bottom tier semiconductor dies, wherein the semiconductor wafer includes a semiconductor substrate and an interconnect structure disposed on the semiconductor substrate. Grooves are formed on the semiconductor wafer, wherein the grooves extend through the interconnect structure, and the semiconductor substrate is revealed by the grooves. An insulating encapsulation is formed over the semiconductor wafer to laterally encapsulate the upper tier semiconductor dies and fill the grooves. A wafer sawing process is performed to saw the insulating encapsulation and the semiconductor wafer along scribe lines of the semiconductor wafer, wherein a maximum lateral dimension of the grooves is wider than a cutting width of the wafer sawing process. In some embodiments, the grooves are formed after placing the upper tier semiconductor dies to the semiconductor wafer. In some embodiments, the grooves are formed through a non-contact cutting process performed along the scribe lines of the semiconductor wafer. In some embodiments, the grooves are formed through a laser grooving process performed along the scribe lines of the semiconductor wafer, the wafer sawing process includes a blade saw process, and a first cutting width of the laser grooving process is wider than a second cutting width of the blade saw process. In some embodiments, the laser grooving process and the blade saw process are subsequently performed on a first surface of the semiconductor wafer on which the upper tier semiconductor dies are placed. In some embodiments, the laser grooving process is performed on a first surface of the semiconductor wafer on which the upper tier semiconductor dies are placed, the blade saw process is performed from a second surface of the semiconductor wafer, and the first surface is opposite to the second surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    placing first semiconductor dies to a semiconductor wafer comprising second semiconductor dies, the semiconductor wafer comprising a semiconductor substrate and an interconnect structure disposed on the semiconductor substrate;
    forming grooves on the semiconductor wafer, the grooves extending through the interconnect structure, and the semiconductor substrate being revealed by the grooves;
    forming an insulating encapsulation over the semiconductor wafer to laterally encapsulate the first semiconductor dies and fill the grooves; and
    performing a wafer sawing process to saw the insulating encapsulation and the semiconductor wafer along the grooves, wherein a portion of the insulating encapsulation remains on sidewalls of the interconnect structure after performing the wafer sawing process.

2. The method as claimed in claim 1, wherein the grooves are formed after placing the first semiconductor dies to the semiconductor wafer, and the grooves are formed through a non-contact cutting process performed along the grooves of the semiconductor wafer.

3. The method as claimed in claim 1, wherein the grooves are formed through a laser grooving process performed along the grooves of the semiconductor wafer, the wafer sawing process comprises a blade saw process, and a first cutting width of the laser grooving process is wider than a second cutting width of the blade saw process.

4. The method as claimed in claim 3, wherein the laser grooving process and the blade saw process are subsequently performed on a first surface of the semiconductor wafer on which the first semiconductor dies are placed.

5. The method as claimed in claim 3, wherein the laser grooving process is performed on a first surface of the semiconductor wafer on which the first semiconductor dies are placed, the blade saw process is performed from a second surface of the semiconductor wafer, and the first surface is opposite to the second surface.

6. A method, comprising:
forming first conductive pillars over a semiconductor wafer;
after forming the first conductive pillars over the semiconductor wafer, mounting a first semiconductor die over the semiconductor wafer;
after mounting the first semiconductor die over the semiconductor wafer, performing a pre-cut process to form grooves on the semiconductor wafer; and
forming an insulating material over the semiconductor wafer to fill the grooves as well as laterally encapsulate the first semiconductor die and the first conductive pillars; and
performing a wafer sawing process to cut the insulating material and the semiconductor wafer along the grooves, wherein the insulating material filled in the grooves is partially removed after performing a wafer sawing process.

7. The method as claimed in claim 6,
after performing the wafer sawing process, a singulated structure comprising a second semiconductor die, the first semiconductor die and a first insulating encapsulation is formed, wherein the first insulating encapsulation is disposed on the second semiconductor die and laterally encapsulates the first semiconductor die.

8. The method as claimed in claim 7, wherein the second semiconductor die comprises a semiconductor substrate and an interconnect structure, the semiconductor substrate comprises a first portion and a second portion disposed on the first portion, the interconnect structure is disposed on the second portion, and a first lateral dimension of the first portion is greater than a second lateral dimension of the second portion.

9. The method as claimed in claim 7 further comprising:
forming second conductive pillars aside the singulated structure;
laterally encapsulating the second conductive pillars and the singulated structure with a second insulating encapsulation; and
forming a redistribution circuit structure over the singulated structure, the second conductive pillars and the second insulating encapsulation.

10. The method as claimed in claim 9, wherein the second semiconductor die is spaced apart from the second insulating encapsulation by the first insulating encapsulation.

11. The method as claimed in claim 6, wherein the grooves are formed after mounting the first semiconductor die over the semiconductor wafer, and the grooves are formed through a non-contact cutting process performed along scribe lines of the semiconductor wafer.

12. The method as claimed in claim 6, wherein the grooves are formed through a laser grooving process performed along scribe lines of the semiconductor wafer, the wafer sawing process comprises a blade saw process, and a first cutting width of the laser grooving process is wider than a second cutting width of the blade saw process.

13. The method as claimed in claim 12, wherein the laser grooving process and the blade saw process are subsequently performed on a first surface of the semiconductor wafer on which the first semiconductor die is placed.

14. The method as claimed in claim 12, wherein the laser grooving process is performed on a first surface of the semiconductor wafer on which the first semiconductor die is placed, the blade saw process is performed from a second surface of the semiconductor wafer, and the first surface is opposite to the second surface.

15. A method, comprising:
forming first conductive pillars and mounting a first semiconductor die on a first redistribution circuit structure of a semiconductor wafer;
performing a first cutting process to form grooves penetrating through the first redistribution circuit structure; and
forming an insulating material on the semiconductor wafer to fill the grooves as well as laterally encapsulate the first semiconductor die and the first conductive pillars; and
performing a second cutting process to partially remove the insulating material and cut the semiconductor wafer along the grooves to form a singulated structure, the singulated structure comprising a second semiconductor die, the first semiconductor die and a first insulating encapsulation, wherein the first insulating encapsulation is disposed on the second semiconductor die and laterally encapsulates the first semiconductor die.

16. The method as claimed in claim 15 further comprising:
laterally encapsulating the singulated structure with a second insulating encapsulation; and
forming a second redistribution circuit structure over the singulated structure and the second insulating encapsulation; and
after performing the second cutting process and prior to forming the second redistribution circuit structure, forming second conductive pillars aside the singulated structure, wherein the second conductive pillars are laterally encapsulated by the second insulating encapsulation, and the second conductive pillars are electrically connected to the second redistribution circuit structure.

17. The method as claimed in claim 16 further comprising:
forming first conductive terminals on the second redistribution circuit structure.

18. The method as claimed in claim 16 further comprising a third redistribution circuit structure over the singulated structure and the second insulating encapsulation, wherein the second redistribution circuit structure and the third redistribution circuit structure are disposed at opposite sides of the singulated structure respectively.

19. The method as claimed in claim 18 further comprising:
forming second conductive terminals on the third redistribution circuit structure.

20. The method as claimed in claim 15 further comprising:
forming a passive component on the second redistribution circuit structure.

* * * * *